US007633153B2

(12) United States Patent
Shimokawa et al.

(10) Patent No.: US 7,633,153 B2
(45) Date of Patent: Dec. 15, 2009

(54) SEMICONDUCTOR MODULE

(75) Inventors: Kazuo Shimokawa, Yokohama (JP);
Takashi Koyanagawa, Yokohama (JP);
Masako Ooishi, Yokohama (JP);
Tatsuya Yamada, Yokohama (JP);
Osamu Usuda, Tatsuno (JP); Yoshiki Endo, Ibo-gun (JP); Taiki Miura, Ibo-gun (JP); Masaki Toyoshima, Himeji (JP); Ichiro Omura, Yokohama (JP); Akio Nakagawa, Fujisawa (JP); Kenichi Matsushita, Meguro-ku (JP); Yusuke Kawaguchi, Miura-gun (JP); Haruki Arai, Yokohama (JP); Hiroshi Takei, Kawasaki (JP); Tomohiro Kawano, Zama (JP); Noriaki Yoshikawa, Yokohama (JP); Morio Takahashi, Fukaya (JP); Yasuhito Saito, Yokohama (JP); Masahiro Urase, Himeji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/778,516

(22) Filed: Jul. 16, 2007

(65) Prior Publication Data

US 2007/0257708 A1 Nov. 8, 2007

Related U.S. Application Data

(62) Division of application No. 11/214,730, filed on Aug. 31, 2005, now Pat. No. 7,514,783.

(30) Foreign Application Priority Data

Aug. 31, 2004 (JP) ............................. 2004-253276

(51) Int. Cl.
*H01L 23/10* (2006.01)

(52) U.S. Cl. ............................. 257/706; 257/E33.075
(58) Field of Classification Search ................. 257/778, 257/276, 625, 675, 706, 707, 712–722, E33.075, 257/E31.131, E23.051, E23.08–E23.113, 257/796
See application file for complete search history.

(56) References Cited

U.S. PATENT DOCUMENTS 6,313,521 B1 11/2001 Baba
(Continued)

FOREIGN PATENT DOCUMENTS

| JP | 11/45976 | 2/1999 |
|---|---|---|
| JP | 2001-291823 | 10/2001 |
| JP | 2002-314029 | 10/2002 |
| JP | 2004-221460 | 8/2004 |
| JP | 2005-223008 | 8/2005 |

OTHER PUBLICATIONS

Email dated May 24, 2008, from Elson Silva to Corwin Umbach requesting that Corwin Umbach file an IDS citing AA, AB and AC.

*Primary Examiner*—Brook Kebede
*Assistant Examiner*—Tony Tran
(74) *Attorney, Agent, or Firm*—Oblon, Spivak, McClelland, Maier & Neustadt, L.L.P.

(57) ABSTRACT

A semiconductor module comprises a mounting board. A plurality of power switching device chips are mounted on the mounting board by flip-chip bonding. The chip has an upper surface and a lower surface and is configured to face the upper surface toward the mounting board. A drive IC chip is mounted on the mounting board by flip-chip bonding. The drive IC chip is operative to drive gates of transistors formed in the plurality of power switching device chips. A plurality of heat sink members are located on the lower surfaces of the plurality of power switching device chips, respectively. A resinous member is provided to seal the plurality of power switching device chips and the drive IC chip in a single package.

2 Claims, 31 Drawing Sheets

U.S. PATENT DOCUMENTS

| | | |
|---|---|---|
| 6,437,240 B2 | 8/2002 | Smith |
| 6,548,890 B2 | 4/2003 | Miyake et al. |
| 6,766,817 B2 | 7/2004 | Da Silva |
| 6,918,404 B2 | 7/2005 | Da Silva |
| 7,066,586 B2 | 6/2006 | Da Silva |
| 7,154,174 B2 | 12/2006 | Maxwell |
| 2003/0085471 A1* | 5/2003 | Iijima et al. ................. 257/774 |
| 2005/0029651 A1 | 2/2005 | Tomioka et al. |
| 2005/0167849 A1 | 8/2005 | Sato |

* cited by examiner

SEMICONDUCTOR MODULE

CROSS-REFERENCE TO RELATED APPLICATION

This application is a divisional of and claims the benefit of priority under 35 USC §120 from U.S. Ser. No. 11/214,730, filed Aug. 31, 2005 now U.S. Pat. No. 7,514,783 and is based upon and claims the benefit of priority under 35 USC §119 from the Japanese Patent Application No. 2004-253276, filed on Aug. 31, 2004, the entire contents of both of which are incorporated herein by reference.

BACKGROUND OF THE INVENTION

1. Field of the Invention

The present invention relates to a semiconductor module such as a multi-chip module.

2. Description of the Related Art

A DC-DC converter is a device that converts a certain voltage DC current into a different voltage DC current. The DC-DC converter is highly efficient and can be downsized. Therefore, it has been utilized as a power source incorporated in small electronic instruments (for example, information communications instruments such as notebook personal computers and mobile phones).

In the information communications instruments such as PCs, a CPU is fine patterned and sped up to provide an advanced low-voltage/large-current power source (drive power source). A supply voltage for the CPU is mainly 5.0 (V) or 3.3 (V) in the year 1995. In recent years, however, the debut of high-performance CPUs with clock frequencies over 1 GHz requires a voltage lowered down to 1.5 (V) and a current in a class of 100 (A). In addition, in order to respond to the operation speed of the CPU, the power source circuit is required to have an operation frequency of 1 MHz or higher. Therefore, it becomes also important to elevate the switching speed of transistors contained in the power source circuit.

The low-voltage/large-current power source has changed the forms of the conventional power source system. In a form of supplying power from a single power source to a plurality of circuits, even slight parasitic impedance on a wire causes a voltage drop. Accordingly, a voltage required for the circuit is not supplied, which causes erroneous operations. At present the form is therefore transferred to another in which power sources are distributed to locate the power sources corresponding to the respective loads close to the loads.

As for the notebook PC, for example, it comprises loads such as a CPU, a LCD screen and a hard disc. The power sources (that is, DC-DC converters) corresponding to the respective loads are located near the loads.

The conventional high-power DC-DC converters include a synchronous commutation non-insulating step-down converter, which comprises an N-channel type power MOSFET (Metal Oxide Semiconductor Field Effect Transistor), an SBD (Schottky Barrier Diode), a PWM (Pulse width Modulation) control IC and others. These components are individually packaged and the packaged components are mounted on a printed circuit board.

Normally, a power switching device such as the power MOSFET used in the power source circuit radiates heat caused from power losses due to on-resistance and switching. Therefore, it is required to attach a heat sink plate to the power MOSFET chip to dissipate the heat to outside the chip. A high-frequency multi-chip module structured to include a heat sink plate attached to a semiconductor chip is disclosed in JP-A 11-45976 (FIG. 1).

SUMMARY OF THE INVENTION

In an aspect the present invention provides a semiconductor module, which comprises a mounting board; a plurality of power switching device chips each having an upper surface and a lower surface and mounted on the mounting board by flip-chip bonding with the upper surface faced toward the mounting board; a drive IC chip mounted on the mounting board by flip-chip bonding and operative to drive gates of transistors formed in the plurality of power switching device chips; a plurality of heat sink members located on the lower surfaces of the plurality of power switching device chips; and a resinous member provided to seal the plurality of power switching device chips and the drive IC chip in a single package.

BRIEF DESCRIPTION OF THE DRAWINGS

in FIG. 1;

DETAILED DESCRIPTION OF THE INVENTION

Figure 1:
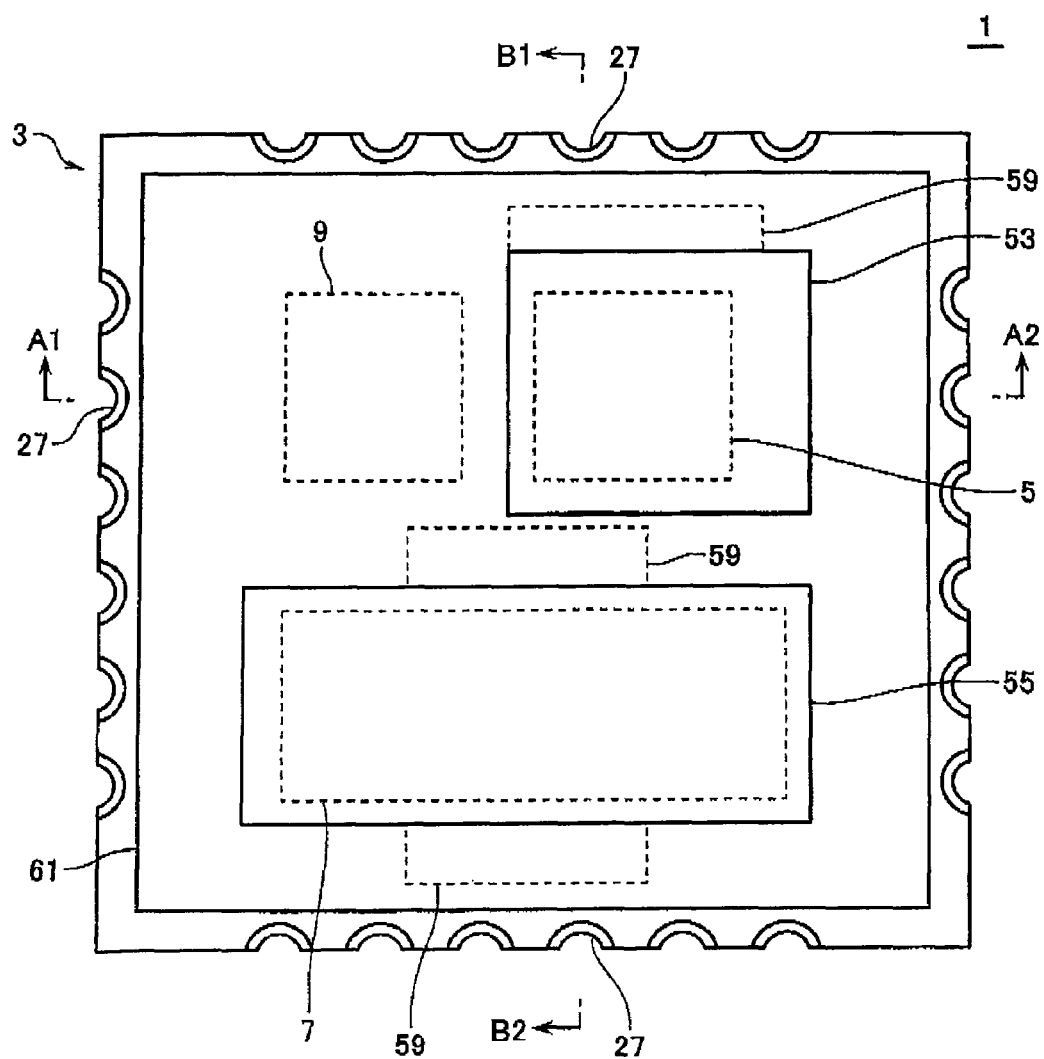
FIG. 1 is a plan view of a semiconductor module according to a first embodiment.

Embodiments of the present invention will now be described with reference to the drawings. In the figures illustrative of the embodiments, the parts same as or similar to those denoted with the reference numerals in the figure once described are given the same reference numerals and omitted from the following description. A semiconductor module according to the embodiment is a multi-chip module, which includes a power MOS chip and a drive IC chip both sealed in a single package. This module serves as part of a DC-DC converter.

The power MOS chip comprises an FET having a gate insulator containing a silicon oxide while the present invention is not limited to this but also applicable to a power MIS chip, which comprises an FET having an insulator (such as a high dielectric) other than the silicon oxide. The power NOS chip and the power MIS chip are also referred to as power switching devices.

First Embodiment (Structure of Semiconductor Module)

Figure 2:
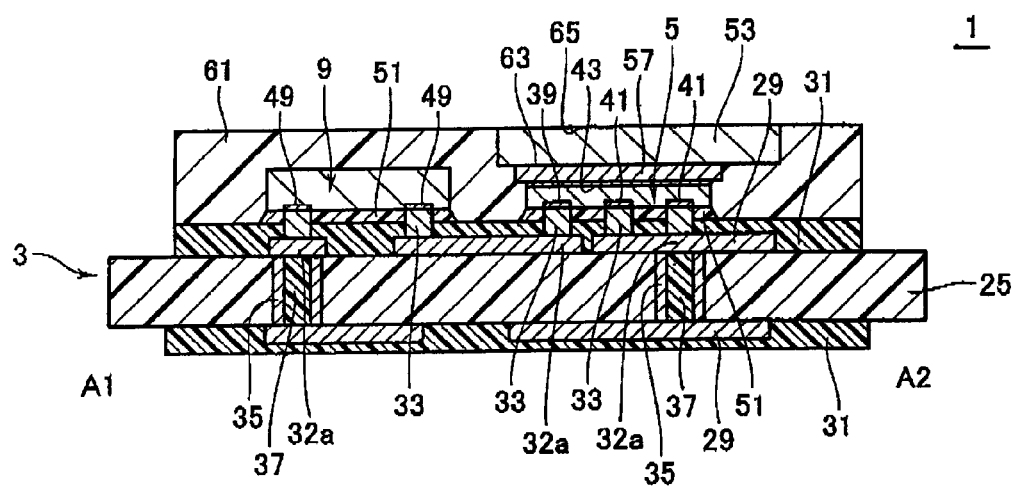
FIG. 2 is a cross-sectional view taken along A1-A2 line in FIG. 1.
Figure 3:
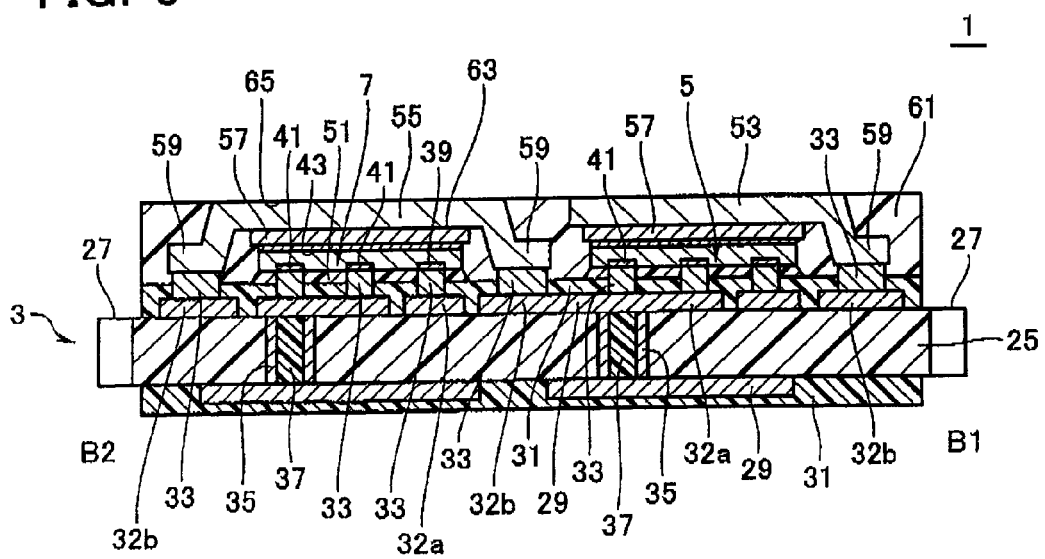
FIG. 3 is a cross-sectional view taken along B1-B2 line 10.

A structure of a semiconductor module according to a first embodiment is described with reference to FIGS. 1-3. FIG. 1 is a plan view of the semiconductor module according to the first embodiment. FIG. 2 is a cross-sectional view taken along A1-A2 line in FIG. 1. FIG. 3 is a cross-sectional view taken along B1-B2 line in FIG. 1.

The semiconductor module 1 comprises amounting board (such as a printed circuit board) 3, two power MOS chips 5, 7 (an example of the power switching devices) and a drive IC chip 9 all mounted on the mounting board. The drive IC chip 9 is a chip operative to drive gates of MOSFETs formed in the power MOS chips 5, 7. The power MOS chip 5 and the drive IC chip 9 are shaped square while the power MOS chip 7 is shaped rectangular. Thus, the chips 5, 7, 9 can be arranged efficiently on the square mounting board 3.

Figure 4:
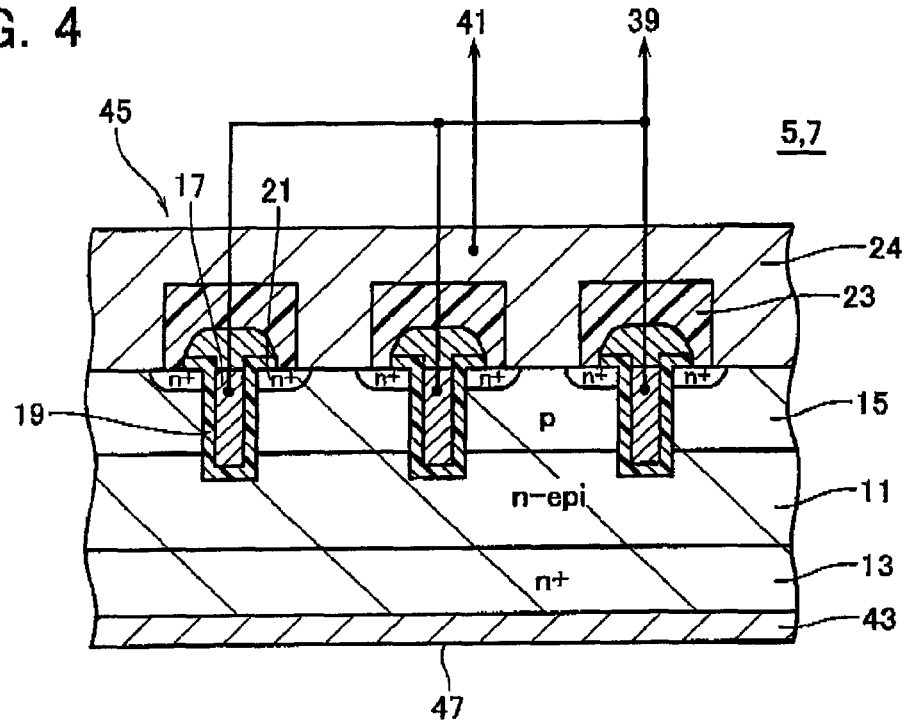
FIG. 4 is a cross-sectional view of part of a power MOS chip provided in the first embodiment.

FIG. 4 is a cross-sectional view of part of the power MOS chip 5, 7. The chip 5 and 7 are structured with a number of vertical MOSFETs connected in parallel. In detail, the chip 5, and 7 comprise an $n^+$-type silicon substrate 13 having an n-type epitaxial layer 11 thereon. An upper layer located above the epitaxial layer 11 is a p-type body region 15. A number of trench gates 17 are formed through the body region 15 in the epitaxial layer 11. A gate oxide film 19 is formed around the trench gate 17.

An $n^+$-type source region 21 is formed in the upper surface of the body region 15. An interlayer insulator 23 is formed covering the trench gate 17 and the source region 21. Contact holes are formed through the interlayer insulator 23 such that a source electrode 24 is connected to the body region 15 and the source region 21 via the contact holes. The silicon substrate 13 serves as an $n^+$-type drain region. A drain electrode 43 is formed entirely over the lower surface of the silicon substrate 13.

As shown in FIGS. 1-3, the mounting board 3 includes a square resin plate 25. The square resin plate 25 has four sides provided with a number of external terminals 27 at a certain 20, pitch. The terminals 27 has a semi-cylindrical shape so that edges of the mounting board 3 are recessed at the terminals 27. Wires 29 are formed on both surfaces of the resin plate 25 and connected to the external terminals 27. The external terminals 27 and the wires 29 are composed of a conductor such as copper foil.

Solder resists 31 are formed on both surfaces of the resin plate 25 covering the wires 29. The solder resists 31 do not cover the external terminals 27 but have apertures through the wires 29 at locations corresponding to electrodes 32a, 32b. A connection member 33 such as solder is screen-printed on the electrodes 32a, 32b.

A number of through-holes are formed through the resin plate 25. A conductive film 35 such as copper is formed, for example, plated on the side of the through-hole. The conductive film 35 is operative to electrically connect between the wires 29 on both surfaces of the resin plate 25. A resin 37 is filled in a space surrounded by the conductive film 35. Instead of the resin 37, a resin containing a metal powder such as copper may be filled to lower the electric resistance.

The power MOS chips 5, 7 and the drive IC chip 9 are mounted on the mounting board 3 by flip-chip bonding. In detail, a gate electrode pad 39 and a source electrode pad 41 are formed on the upper surface of the power MOS chip 5, 7 and a drain electrode pad 43 is formed on the lower surface thereof. The electrode pads 39, 41 are formed in an upper layer of the source electrode 24 shown in FIG. 4. Bump electrodes may be formed on the electrode pads 39, 41. The gate electrode pad 39 is commonly connected with the trench gates 17. The source electrode pad 41 is connected with the source electrode 24.

The gate electrode pad 39 and the source electrode pad 41 on the power MOS chips 5, 7 and the electrode pad 49 on the drive IC chip 9 are soldered to the electrode 32a on the mounting board 3 with the connection member 33. A space between the chips 5, 7, or 9 and the mounting board 3 is filled with an underfill material 51.

A square heats sink member 53 is arranged on the lower surface 47 (FIG. 4) of the power MOS chip 5 so as to cover the power MOS chip 5. Similarly, a rectangular heat sink member 55 is arranged on the lower surface 47 (FIG. 4) of the power MOS chip 7 so as to cover the power MOS chip 7. The heat sink members 53 and 55 comprise respective single metallic heat sink plates.

The heat sink members 53 and 55 have a side partly serving as a terminal 59. The heat sink member 53 is provided with the terminal 59 on one of four sides. To the contrary, the heat sink member 55 is provided with the terminals 59 on two opposite longer sides of four sides (that is, two opposite longer sides of the rectangular chip 7). The heat sink members 53 and 55 are folded at the terminal 59 to form a step, which is soldered to the electrode 32b on the mounting board 3 by the connection member 33. Therefore, the heat sink members 53 and 55 are fixed to the electrode 32b on the mounting board 3 and electrically connected to the wire 29 on the mounting board 3.

The heat sink member 53 has only one terminal 59 and is fixed at one location accordingly. On the other hand, the heat sink member 55 has two terminals 59 and is fixed at two locations accordingly. This is a requirement from the electric circuit that contains the heat sink members 53, 55. Therefore, depending on the requirement from the electric circuit, if two terminals 59 are formed on the heat sink member 53, the heat sink member 53 is fixed at two locations. If the heat sink member 53 is fixed at one location, parallelism of the heat sink member to the mounting board may not be maintained. Measures for such the case will be described in a second embodiment.

The heat sink members 53 and 55 each has a flat portion other than the terminal 59, which opposes the lower surface of the power MOS chip 5, 7 and serves as a heat sink. At the flat portion, the heat sink members 53 and 55 are soldered to the drain electrode 43 on the lower surface of the power MOS chip 5, 7 via a conductive connection member 57. Therefore, each heat sink member is electrically connected to the drain electrode on the lower surface of the corresponding one of the power MOS chips (or to the source electrode if the chip has the source electrode on the lower surface thereof).

The heat sink members 53 and 55: (1) cover the power MOS chips 5, 7; (2) have the terminals 59 connected to the electrode 32b, and (3) have the same height at the heat sink members 53, 55 (that is, are coplanar). Therefore, the size of the step of the heat sink members 53 and 55 is determined in consideration of a thickness of the connection member 57, thickness of the power MOS chip 5, 7, a height of the electrode pad 39, 41, a height of the connection member 33, and a height of the electrode 32a, 32b.

The heat sink members 53, 55 serves as a heat sink as well as a wire. Accordingly, copper is employed as a material because it has a thermally and electrically excellent conductivity. Alternatively, aluminum may also be employed because aluminum is higher in electric resistance but lighter and better in workability than copper. An iron-based material (such as a 42 alloy) may also be employed as a material of the heat sink members 53, 55. This material has a thermal expansion coefficient closer to that of the material of the power MOS chip 5, 7 and prevents the heat sink members 53, 55 from suffering fatigue due to the thermal expansion.

When aluminum or the iron-based material is employed as the heat sink members 53, 55, vapor deposition, thermal spray plating or plating may be applied to form a metal layer (such as copper, gold, silver, and nickel) or an alloy layer (such as solder, and silver wax) on the portion connected to the connection member 33, (that is, the terminal 59), and the portion connected to the connection member 57, of the heat sink members 53, 55. Formation of such the layer achieves excellent connectivity.

The materials and thicknesses of the heat sink members 53, 55 are usually same but may be made different for the reasons such as a difference between the amounts of heat radiation from the power MOS chips 5, 7.

If the thickness of the heat sink members 53, 55 is too thin, the temperature at the heat sink members 53, 55 sharply rises undesirably. Therefore, a guide of the thickness of the heat sink members 53, 55 is preferably 100 μm or thicker (more preferably 200 μm or thicker).

The heat sink members 53 and 55 covers the lower surface of the corresponding power MOS chip 5, 7 entirely to improve the heat radiation and lower the electric resistance. The heat sink members 53 and 55 may expose the lower surface of the power MOS chip 5 and 7 partly instead of covering it entirely.

A resinous member 61 is fixed on the mounting board 3 to seal the power MOS chips 5, 7 and the drive IC chip 9 in a single package. The heat sink members 53 and 55 each has one surface 63 facing the lower surface of the corresponding power MOS chip 5 or 7 and the other surface 65 located opposite to the one surface. The other surface 65 is exposed to outside the semiconductor module 1. Therefore, all the heat sink members are exposed to outside the semiconductor module 1.

(Circuitry and Operation of DC-DC Converter)

Figure 5:
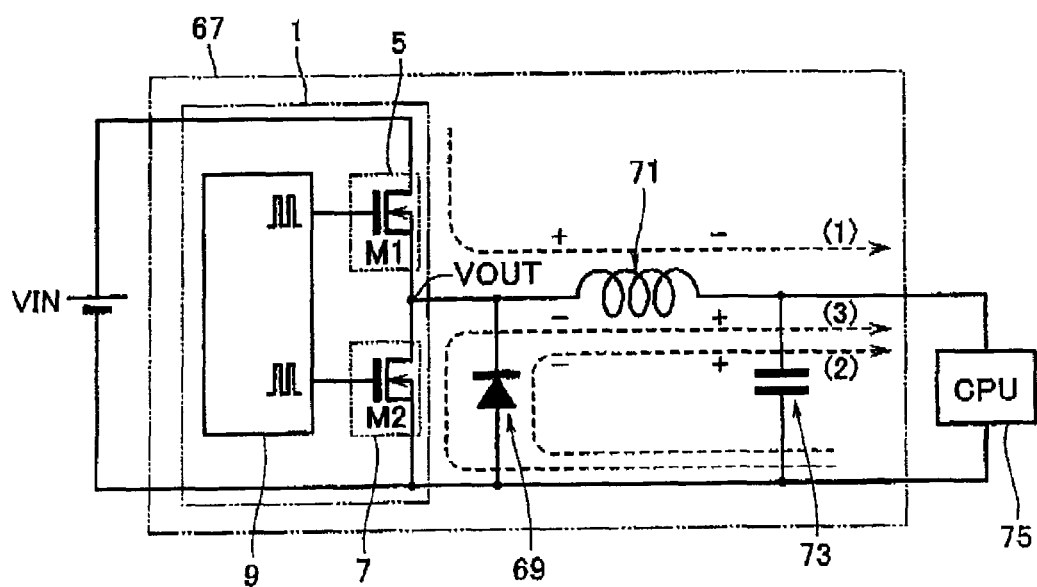
FIG. 5 is a circuit diagram of a DC-DC converter according to the first embodiment.

The following description is given to the circuitry and operation of a DC-DC converter that contains the semiconductor module 1. FIG. 5 is a circuit diagram of the DC-DC converter 67. The DC-DC converter 67 is of the synchronous commutation non-insulating step-down type. This is the most possible circuit to reduce the power loss and enhance the conversion efficiency.

The power MOS chip (an element on the control side) 5 at a higher potential and the power MOS chip (an element on the synchronous commutation side) 7 at a lower potential both employ an N-channel MOSFET having a lower on-resistance and a lower gate capacitance. The power MOS chip 7 is connected in parallel with an SBD (Shottky Barrier Diode) 69 having a lower VF. The power MOS chips 5 and 7 have gate terminals connected to the drive IC chip 9 for driving the gates.

The gates of the power MOS chips 5 and 7 are normally driven under the PWM (Pulse Width Modulation) control. The PWM control is a control scheme to stabilize the DC output voltage from a switching power source. Namely, the output voltage is controlled by varying a ratio of the ON time to the OFF time of the switching transistor (power MOS chip 5). When the output voltage lowers (elevates), the ON time is elongated (shortened) to keep a constant voltage. The gates of the power MOS chips 5 and 7 may also be driven under the PPM (Pulse Frequency Modulation) control. The PFM control is a control scheme to control the output voltage by varying the switching frequency while maintaining the ON time of the switching transistor (power MOS chip 5) unchanged. When the output voltage lowers (elevates), the switching frequency is increased (decreased) to keep a constant voltage.

An inductor 73 and a condenser 73 are connected to the DC-DC converter 67 on the output side. A load such as a CPU 75 is connected across the output of the DC-DC converter 67.

Figure 6:
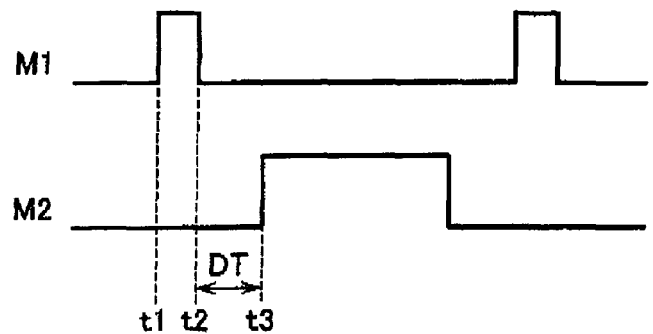
FIG. 6 is a timing chart of signals fed into power MOS chips 5, 7 in FIG. 5.

The basic operation of the DC-DC converter 67 is described next with reference to FIGS. 5 and 6. FIG. 6 is a timing chart of signals fed into the power MOS chips 5 and 7. If an input voltage VIN is 24 V, it is converted at the converter 67 into 1.5 V, for example, which is then supplied to the CPU 75.

At time t1, while the MOSFET (M2) in the power MOS chip 7 is kept off, the MOSFET (M1) in the power MOS chip 5 is turned on. As a result, application of the input voltage VIN causes a current shown by the arrow (1) to flow to supply power to the CPU 75 through the inductor 71. At time t2, the MOSFET (M1) is turned off to halt supplying power to the CPU 75 through 10; application of the input voltage VIN. Instead, the power accumulated in the inductor 71 causes a current shown by the arrow (2) to commutate via the SED 69 to supply power to the CPU 75.

After elapse of a certain dead time DT set for prevention of through current from passing through the MOSFET (M1) and the MOSFET (M2), the MOSFET (M2) is turned on at time t3. The MOSFET (M2) is lower in resistance than the SBD 69 so that the current generated from the power accumulated in the inductor 71 communicates through not the SBD 69 but the MOSFET (M2) as shown by the arrow (3) to supply power to the CPU 75. The condenser 73 is employed to smooth the output voltage waveform. The DC-DC converter can work without the power MOS chip 7 or the MOSFET (M2).

The following description is given to the reason why the MOSFET (M2) is provided. At time t2, the current shown by the arrow (2) flows through the SBD 69. The flow of the current through the SBD 69 causes a voltage drop, which causes a corresponding loss in power supplied to the CPU 75. A MOSFET can be made smaller in voltage drop than an SBD. Therefore, the current is controlled to flow via the SBD 69 during the dead time DT and flow via the MOSFET (M2) after elapse of the dead time DT to supply power to the CPU 75 efficiently.

(Primary Effects of First Embodiment)

A primary effect of the first embodiment is described next. The first embodiment is possible to achieve a reduction of area in mounting space, a reduction in wire impedance, and an improvement in heat radiation for a semiconductor device containing the semiconductor module (such as the DC-DC converter 67), which are described below in detail.

A conventional DC-DC converter comprises components such as a power MOS chip, a drive IC chip and an SBD (Schottky Barrier Diode), which are individually packaged, and these packaged components are attached to a printed circuit board. In recent years, lowering the voltage and increasing the current have proceeded rapidly for PCs and so forth. In the DC-DC converter with such the structure, there are problems associated with an increase in mounting space, an increase in wire impedance and difficulty in heat radiation.

The increase in mounting space is described first. A current capacity required in the conventional DC-DC converter may exceed a rated current of a single MOSFET (one power MOS chip). In such the case, a plurality of power MOS chips are connected in parallel to provide the current capacity required. Therefore, the number of the power MOS chips must be increased to support the need for increasing the current, resulting in the increase in mounting space, which prevents the DC-DC converter from being downsized as a problem.

The increase in wire impedance is described next. The increased mounting space enlarges the area of the mounting board, which inevitably elongates the wire length resulting in increases in resistance and inductance. The increase in resistance causes a voltage drop, which causes a lack in voltage applied across a load and leads to erroneous operations. The increase in inductance interferes with the achievement of high speed and high frequency properties and increases ringing, which may also cause erroneous operations.

Finally, the problem associated with the difficulty in heat radiation is described. A load such as a CPU has a large amount of heat radiation and accordingly requires attachment of a large heat sink member to the load itself. Therefore, in the vicinity of the load, it is difficult to ensure a space to attach the heat sink member for the power MOS chip. If no heat sink member is attached to the power MOS chip, the number of the power MOS chips is increased to reduce the MOSFET resistance to avoid an excessive power loss in the power MOS chip. The increased number of the power MOS chips, however, causes problems associated with the increase in mounting space and the increase in wire impedance.

In the semiconductor module 1 according to the first embodiment, the power MOS chips 5, 7 and the drive IC chip 9 are encapsulated in a single package. In a word, these chips are mounted on an identical surrounder. Therefore, the mounting space of the DC-DC converter 67 can be reduced (downsized).

Downsizing improves the mounting density and accordingly shortens the wire between elements. Thus, the wire impedance on the DC-DC converter 67 can be reduced. Accordingly, the DC-DC converter 67 can operate at a high speed and a high frequency.

The heat sink members 53 and 55 can dissipate the heat generated from the power MOS chip 5 and 7 efficiently. In particular, as the other surface 65 of the heat sink members 53 and 55 is exposed to outside the semiconductor module 1, the heat radiation can be further improved. In the first embodiment, the power MOS chip 5, 7 is mounted by flip-chip bonding and the heat sink members 53, 55 is located on the lower surface of the power MOS chip 5, 7. Thus, the heat sink members 53, 55 can be located without increasing the mounting area. In addition, even if the power MOS chip 5, 7 is located close to the CPU, it does not prevent attachment of the heat sink member to the CPU. Further, the heat sink members 53 and 55 each is attached to the power MOS chip 5, 7 by the connection member 57. As the connection member 57 is excellent in thermal conductivity, the heat generated from the chip 5 and 7 can transfer to the heat sink member 53, 55 quickly via the connection member 57. Also from this viewpoint, heat can be dissipated efficiently.

No heat sink member is attached to the drive IC chip 9. In a word, the drive IC chip 9 is not covered with the heat sink member as is the power MOS chip 5, 7. In order to dissipate the heat generated from the drive IC chip 9 efficiently, however, a heat sink member may be disposed on the lower surface of the drive IC chip 9.

The first embodiment also exerts the following effect. The heat sink member 53, 55 also serves as a wire that connects the drain electrode 43 on the power MOS chip 5, 7 to the wire 29 on the mounting board 3. The heat sink members 53 and 55 each has a wider current path and accordingly serves as a wire with less parasitic resistance and parasitic inductance.

(Modification of First Embodiment)

Figure 7:
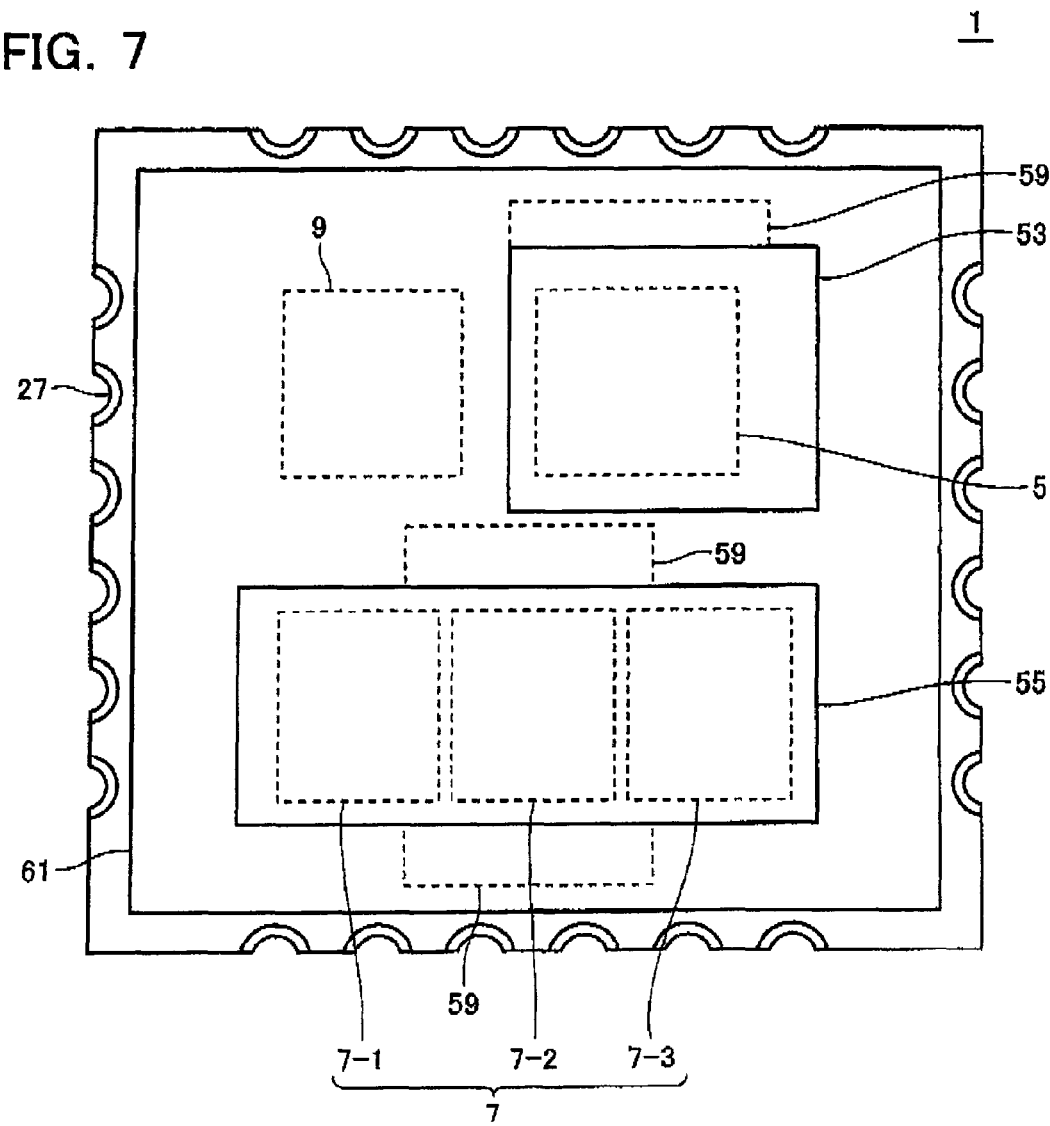
FIG. 7 is a plan view of a modification of the semiconductor module according to the first embodiment.

FIG. 7 is a plan view of a modification of the semiconductor module 1 according to the first embodiment, corresponding to FIG. 1. The power MOS chip 7 configures a low-potential circuit while the power MOS chip 5 configures a high-potential circuit. The power MOS chip 7 is split into three chips 7-1, 7-2, 7-3. At this point, the semiconductor module 1 in FIG. 7 differs from that in FIG. 1. The heat sink member 55 has regions corresponding to the chips 7-1, 7-2, 7-3, which serve as heat sink members for the respective chips. Therefore, it can be said in this case that a plurality of heat sink members are linked with each other to configure a single heat sink plate (heat sink member 55).

The power MOS chip 7 in FIG. 1 has relatively large dimensions with a large thermal expansion efficiency and a large thermal stress. In the modification of FIG. 7, the power MOS chip 7 is split into three relatively small chips 7-1, 7-2, 7-3 to ensure the current capacity and reduce the thermal stress. A plurality of power MOS chips 7-1, 7-2, 7-3 may be arranged for feeding a large current to the semiconductor module 1 instead of reducing the thermal stress.

In the fifth embodiment, of the low-potential circuit and the high-potential circuit, the low-potential circuit includes three power MOS chips. It is sufficient that, however, at least one of the low-potential circuit and the high-potential circuit includes a plurality of power MOS chips. The number of chips is not limited to three but may be two or more.

Second Embodiment

Figure 8:
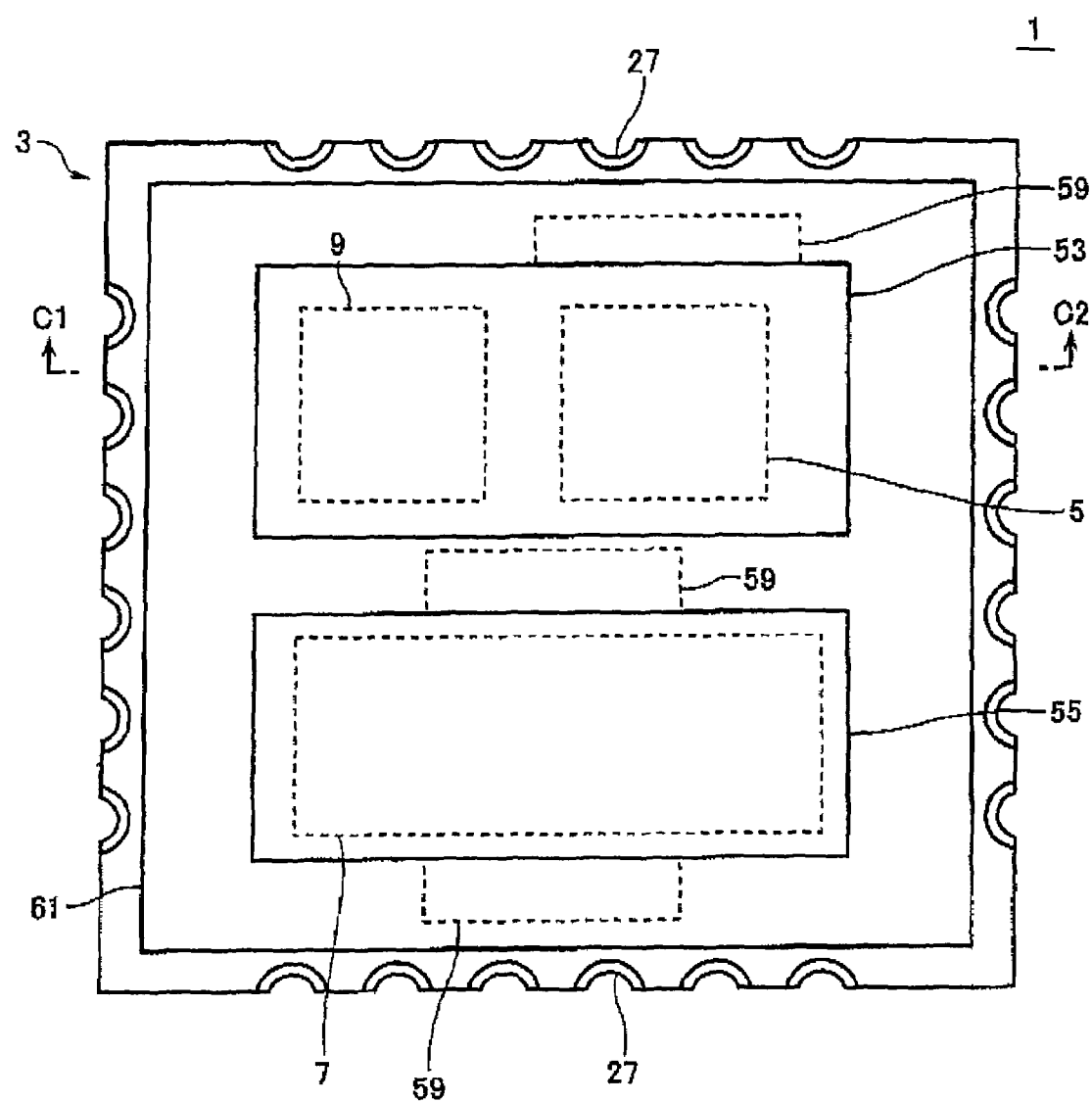
FIG. 8 is a plan view of a semiconductor module according to a second embodiment.
Figure 9:
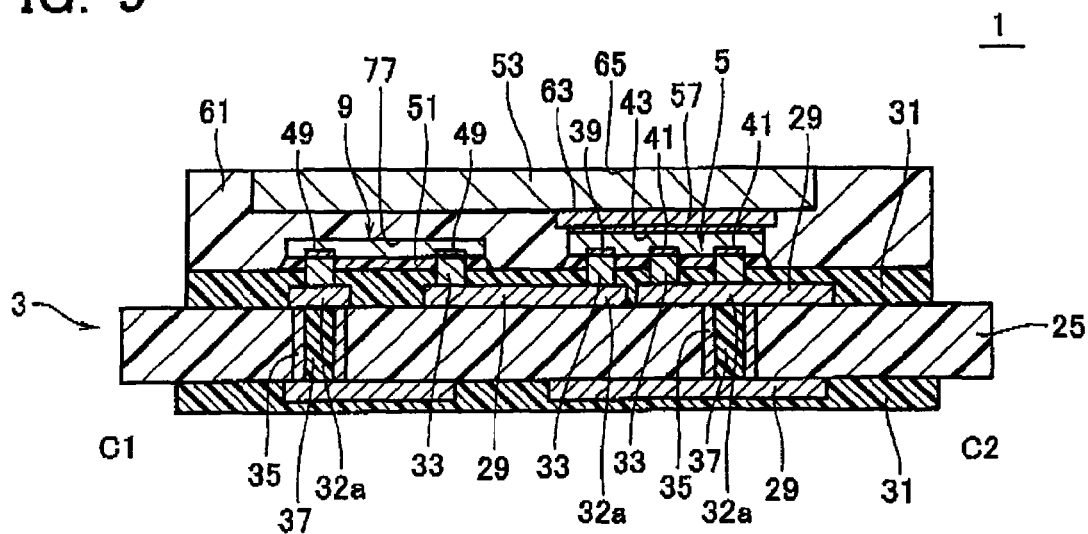
FIG. 9 is a cross-sectional view taken along C1-C2 line in FIG. 8.

FIG. 8 is a plan view of a semiconductor module 1 according to a second embodiment. FIG. 9 is a cross-sectional view taken along C1-C2 line in FIG. 8. FIGS. 8 and 9 are employed to describe the second embodiment about differences from the first embodiment.

In the second embodiment, the heat sink member 53 covering the power MOS chip 5 extends over the drive IC chip 9 so as to cover the drive IC chip 9. The power MOS chip 5 and the drive IC chip 9 share the heat sink member 53. A separate heat sink member for covering the drive IC chip 9 may be arranged aside from the heat sink member 53. In comparison with such the case, the heat sink member can be given a larger area, which improves the heat radiation by the extent.

The drive IC chip 9 has a lower surface 77 kept at the ground potential, which differs from the potential on the drain electrode 43 of the power MOS chip 5. Therefore, the heat sink member 53 is insulated from the drive IC chip 9 via a resinous member 61. In a word, the heat sink member 53 is insulated from the drive IC chip 9 and extends over the drive IC chip 9.

There is a possible inverted structure. In this structure, the heat sink member 53 is connected to the lower surface 77 of the drive IC chip 9 by a connection member, and the heat sink member 53 is insulated from the power MOS chip 5 via the resinous member 61. It is easier for heat to conduct via the conductive connection member 57 than via the resin. The power MOB chip 5 has a larger amount of heat radiation than the drive IC chip 9 has. Therefore, in the second embodiment, the power MOS chip 5 is connected to the heat sink member 53 via the connection member 57.

The above connection makes the potential on the heat sink member 53 equal to the drain potential on the power MOS chip 5. Accordingly, the drive IC chip 9 is shielded by the heat sink member 53 held at the fixed potential. The lower surface 77 of the drive IC chip 9 is kept at the ground potential. In a high-frequency DC-DC converter, a high frequency fluctuates the ground potential to erroneously operate the drive IC chip 9 possibly. In the second embodiment, as the drive IC chip 9 is shielded by the heat sink member 53 kept at the fixed potential, it is possible to prevent the high frequency from causing fluctuation of the ground potential.

There is no terminal of the heat sink member between the chips 5 and 7. Thus, a distance between the chips 5 and 7 is relatively short. Accordingly, during formation of the connection member 57 on the lower surface of the chip 5, the connection member 57 may possibly extend and bring the connection member 57 into contact with the chip 9. Therefore, in the second embodiment, the drive IC chip 9 is polished thin to make the thickness of the drive IC chip 9 (for example, 140 μm) thinner than the thickness of the power MOS chip 5 (for example, 150 μm). This is effective to separate the lower surfaces of the chips 5, 7 from each other without increasing the flat area between the chips 5, 7.

Figure 10:
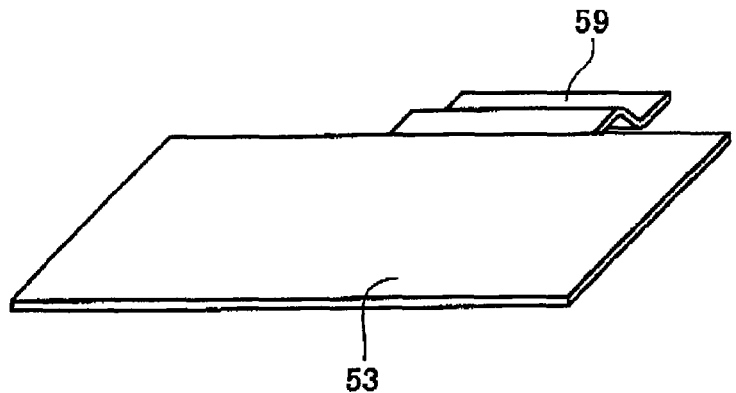
FIG. 10 is a perspective view of a heat sink member according to the second embodiment.

In the second embodiment, as the heat sink member 53 extends over the drive IC chip 9, the heat sink member 53 is shaped rectangular. FIG. 10 is a perspective view of the heat sink member 53 according to the second embodiment. The heat sink member 53 is provided with a single terminal 59 and fixed on the mounting board 3 at one location. The terminal 59 is formed on part of a longer side of the heat sink member 53. Therefore, the heat sink member 53 is held unstable, and the parallelism of the heat sink member 53 to the mounting board 3 may not be kept occasionally. Arrangement of another terminal can keep the parallelism though such the terminal may not be required on the electric circuit.

Figure 11:
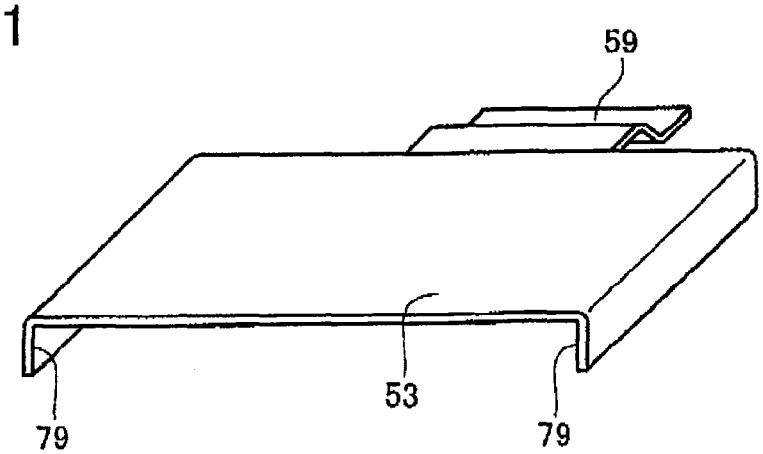
FIG. 11 is a perspective view of a modification of the heat sink member according to the second embodiment.

In such the case, the modification of the heat sink member 53 according to the second embodiment shown in FIG. 11 is possible to keep the parallelism of the heat sink member 53. The heat sink member 53 includes two folded portions 79, which are formed by folding two opposite shorter sides thereof. The folded portions 79 are mounted on the solder resist 31 on the mounting board 3 to keep the parallelism of the heat sink member 53 having only one terminal 59.

Third Embodiment

Figure 12:
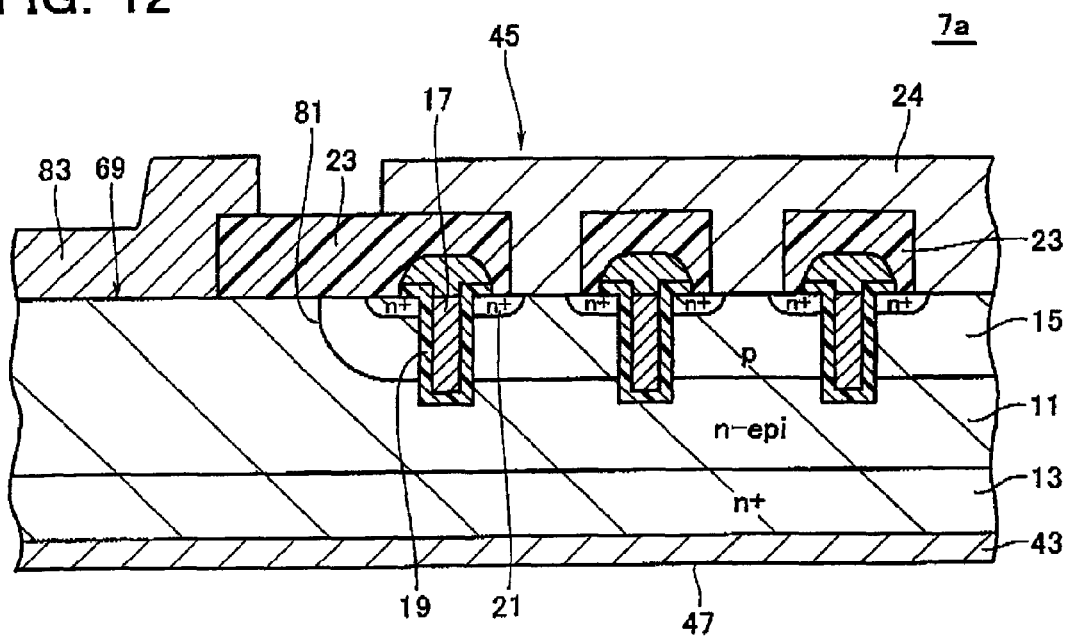
FIG. 12 is a cross-sectional view of part of a low-potential power MOS chip provided in a third embodiment.
Figure 13:
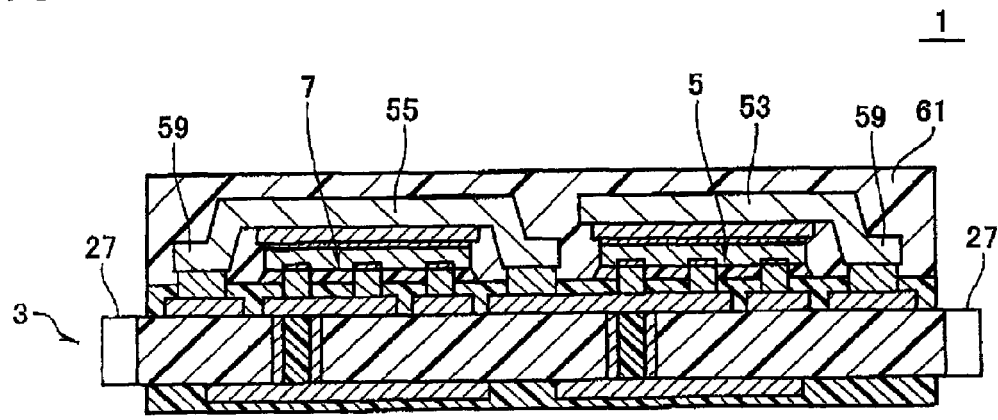
FIG. 13 is a cross-sectional view of a semiconductor module in a first aspect according to a fourth embodiment.

Different from the preceding embodiment, a third embodiment comprises a low-potential power MOS chip with a built-in SBD. FIG. 12 is a cross-sectional view of part of the low-potential power MOS chip 7a provided in the third embodiment, corresponding to the power MOS chip 7 in FIG. 4. An SBD 69 is formed at a certain distance away from an end terminal 81 of a MOSFET formation region. The certain distance means a distance that prevents the MOSFET and the SBD from interfering with each other.

The SBD 69 includes an epitaxial layer 11 and a metal layer 83 such as aluminum formed thereon. When the epitaxial layer 11 makes contact with the metal layer 83, a Schottky barrier is made at the contact portion. The SBD 69 is connected in parallel with the MOSFET in the power MOS chip 7. A p-n junction diode may be employed instead of the SBD 69.

When the power MOS chip 7a with the built-in SED 69 is employed in the semiconductor module as in the third embodiment, the number of components can be made smaller than when a chip of the SBD 69 is employed. This makes it possible to shorten the time for fabricating the semiconductor module and downsize the semiconductor module. In addition, no wire is required to connect the power MOS chip 7a with the chip of the SBD 69. Accordingly, it is possible to remove the impedance associated with such the wire and provide the semiconductor module with an excellent high-speed performance.

Fourth Embodiment

In the semiconductor module 1 according to the first embodiment shown in FIG. 3, the heat sink members 53, 55 are both exposed to outside the semiconductor module 1. When the heat sink members 53, 55 are exposed to outside the semiconductor module 1, the heat radiation effect can be improved while it is required to prevent the power MOS chips 5, 7 from short-circuiting with each other and with external. A semiconductor module according to a fourth embodiment is mainly characterized by a short circuit protective structure.

FIGS. 13-16 are cross-sectional views of a semiconductor module in first through fourth aspects according to the fourth embodiment, corresponding to FIG. 3. In the semiconductor module 1 of the first aspect shown in FIG. 13, the heat sink members 53, 55 are covered with the resinous member 61. In a word, a plurality of heat sink members are all covered with the resinous member 61 to achieve the short circuit protection. When the amounts of heat radiation from the power MOS chips 5, 7 are relatively small, the chips 5, 7 can operate with no problem even if the heat sink members 53, 55 are covered with the resinous member 61. In such the case, the first aspect can be utilized. Instead of forming the resinous member 61, grease or the like may be coated over the heat sink members 53, 55 shown in FIG. 3.

Figure 14:
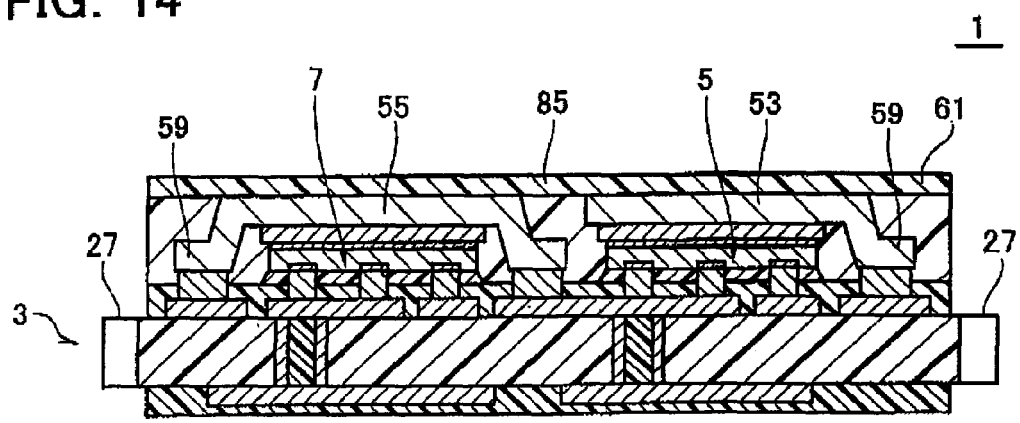
FIG. 14 is a cross-sectional view of a semiconductor module in a second aspect according to the fourth embodiment.

The semiconductor module 1 of the second aspect shown in FIG. 14 is structured to include an insulating heat sink plate 85 formed over the heat sink members 53, 55 of the semiconductor module shown in FIG. 3. The heat sink plate 85 is formed of a material such as ceramics. The second aspect is possible to improve the heat radiation better than the first aspect.

Figure 15:
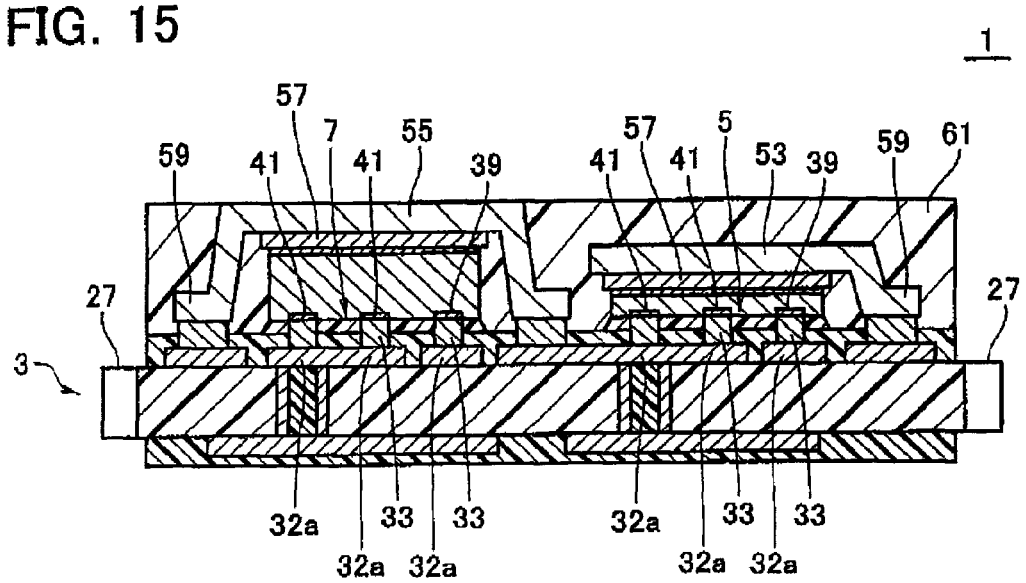
FIG. 15 is a cross-sectional view of a semiconductor module in a third aspect according to the fourth embodiment.

The semiconductor module 1 of the third aspect shown in FIG. 15 includes the heatsink member 53 covered with the resinous member 61 and the heat sink member 55 exposed to outside. Therefore, a plurality of heat sink members include some heat sink member(s) exposed to outside. As the power MOS chip 7 has a relatively large amount of heat radiation, the heat sink member 55 is exposed to outside. The heat sink member 53 is covered with the resinous member 61 so that the power MOS chips 5 and 7 can be prevented from short-circuiting with each other.

In the third aspect, the power MOS chip 7 is controlled to have a thickness larger than that of the power MOS chip 5 to expose the heat sink member 55 to outside. Other than this part, the similarity is also found in the electrode 32a on the mounting board, the connection member 33, the electrode pads 39, 41, and the connection member 57. For example, the electrode 32a corresponding to the power MOS chip 7 is controlled to have a height larger than that of the electrode 32a corresponding to the power MOS chip 5. The thickness of the chip and the height of the electrode may be controlled in combination or singly.

Figure 16:
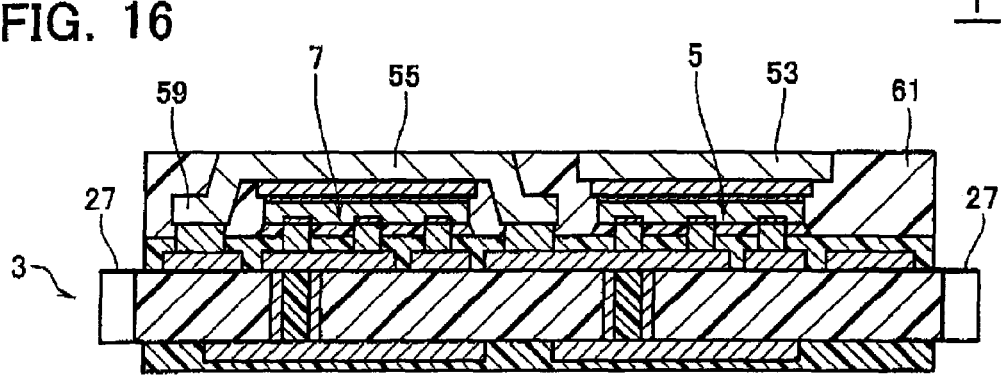
FIG. 16 is a cross-sectional view of a semiconductor module in a fourth aspect according to the fourth embodiment.

The semiconductor module 1 of the fourth aspect shown in FIG. 16 comprises the heat sink members 53 and 55 exposed to outside, and the heat sink member 53 located on the lower surface of the power MOS chip 5 has no terminal 59. Therefore, the heat sink member 53 can not serve as a wire.

Fifth Embodiment

Figure 17:
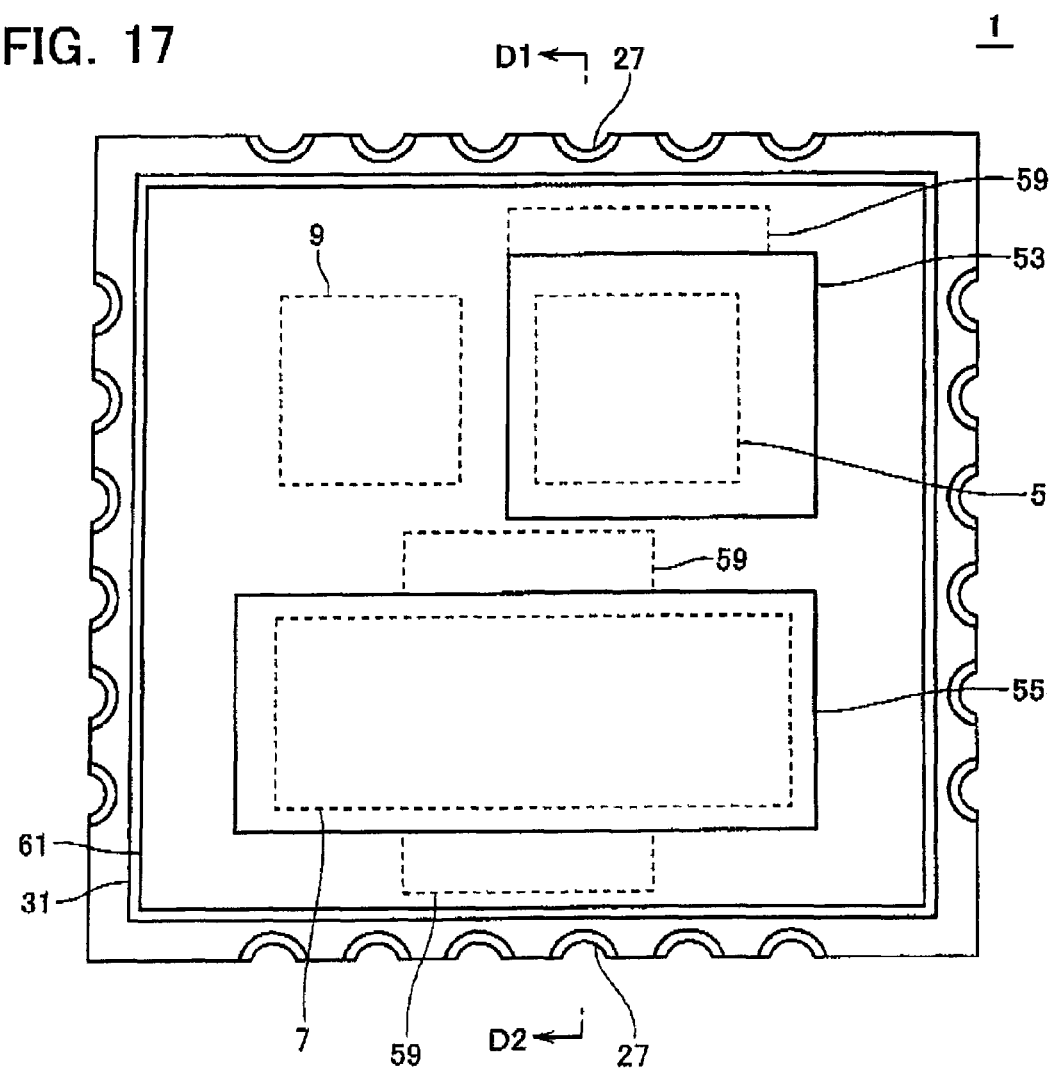
FIG. 17 is a plan view of a semiconductor module according to a fifth embodiment.
Figure 18:
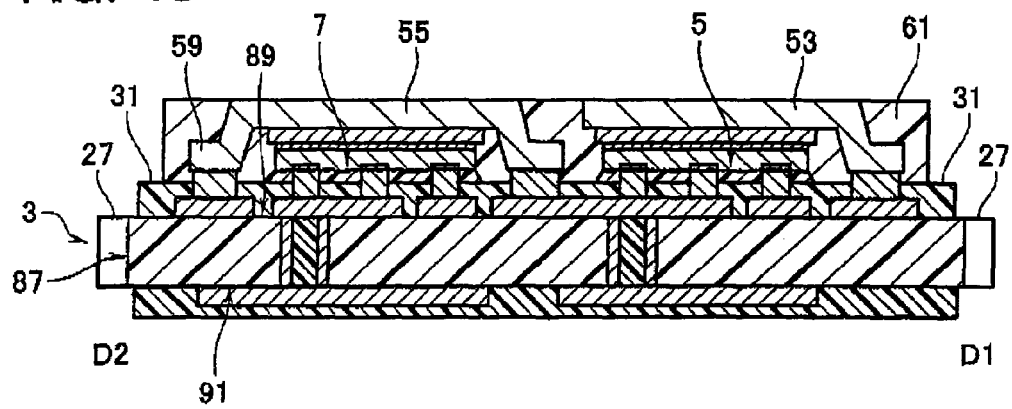
FIG. 18 is a cross-sectional view taken along D1-D2 line in FIG. 17.

FIG. 17 is a plan view of a semiconductor module 1 according to a fifth embodiment. FIG. 18 is a cross-sectional view taken along D1-D2 line in FIG. 17. A difference from the semiconductor module 1 of FIG. 1 lies in location of the outer edge of the solder resist 31. The fifth embodiment is described below in detail.

The mounting board 3 is similar to the mounting board 3 of the preceding embodiments and defined by sides 87, a surface 89 facing the chips 5, 7, 9, and an opposite surface 91 located opposite to the surface 89. On the other hand, different from the preceding embodiments, the solder resist 31 of the fifth, embodiment is sandwiched between the edge of the resinous member 61 and the facing surface 89. In addition, it is formed on the facing surface 89 along the edge of the resinous member 61 to protrude beyond the resinous member 61. This is effective to prevent the resinous member 61 from flowing to the external terminal 27 at the time of molding. This effect will be described further in the steps of fabricating the semiconductor module 1 according to the fifth embodiment.

Figure 19:
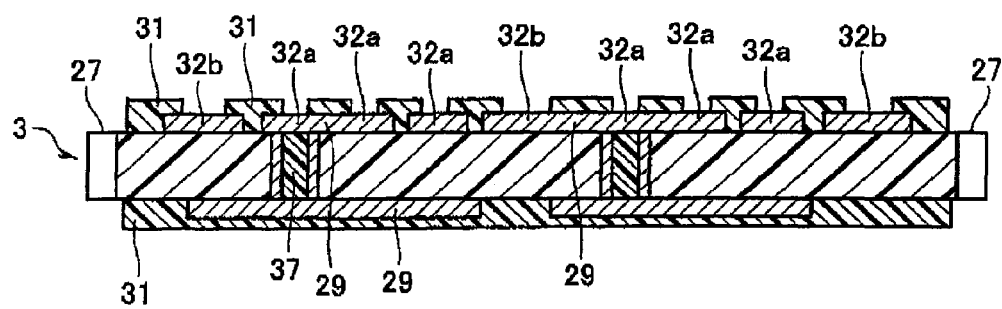
FIG. 19 is a first process diagram illustrative of a method of fabricating the semiconductor module according to the fifth embodiment.

FIGS. 19-24 show the steps of fabricating the semiconductor module 1 according to the fifth embodiment, in which the mounting board 3 and others are shown in section. As shown in FIG. 19, the mounting board 3 is prepared as including the wire 29, the electrodes 32a, 32b and so forth formed thereon. The wire 29 is covered with the solder resist 31, and the electrodes 32a, 32b are exposed. The mounting board 3 is sized 11 mm long/wide.

Figure 20:
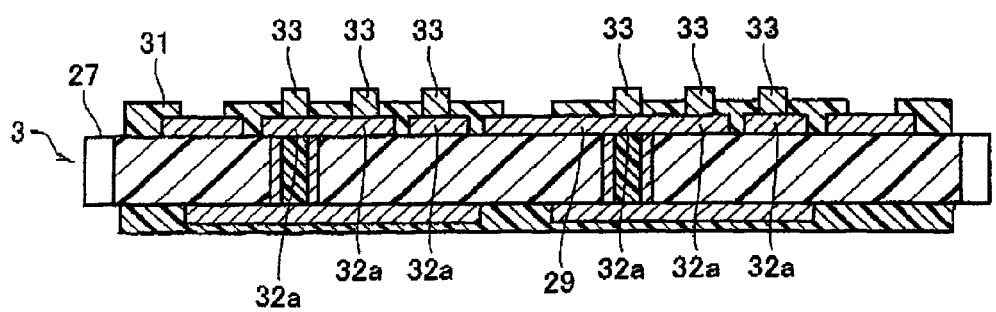
FIG. 20 is a second process diagram of the same method.

As shown in FIG. 20, a process of printing is applied to supply the connection member 33 onto the electrodes 32a, 32b. The connection member 33 is solder, specifically Sn10Pb90 solder. There are available solder materials such as Sn—Zn based solder and Sn—Bi based solder other than Sn—Pb based solder.

Figure 21:
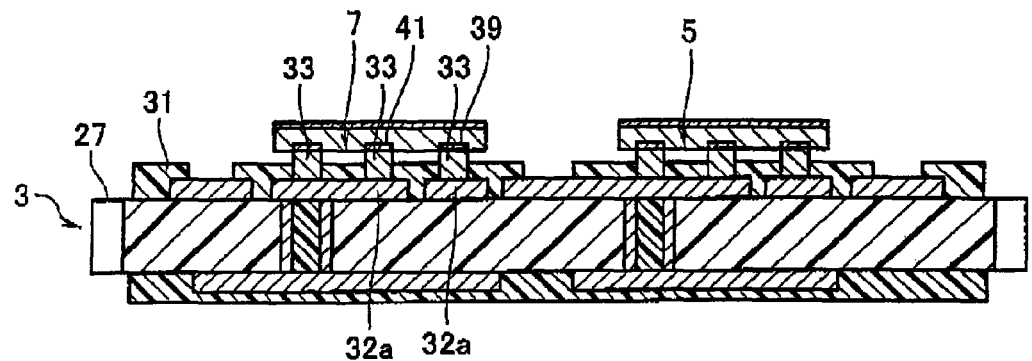
FIG. 21 is a third process diagram of the same method.

As shown in FIG. 21, a mounter (not shown) is employed to mount the chips 5, 7, 9 while the electrode pads 39, 41 on the power MOS chips 5, 7 and the electrode pad on the drive IC chip 9 (not shown) are faced to the electrode 32a. The power MOS chip 5 is sized 2 mm long/wide and 250 μm thick. The power MOS chip 7 is sized 3 mm.times.5 mm long/wide and 250 μm thick. The drive IC chip 9 is sized 2 mm long/wide and 200 μm thick.

Figure 25:
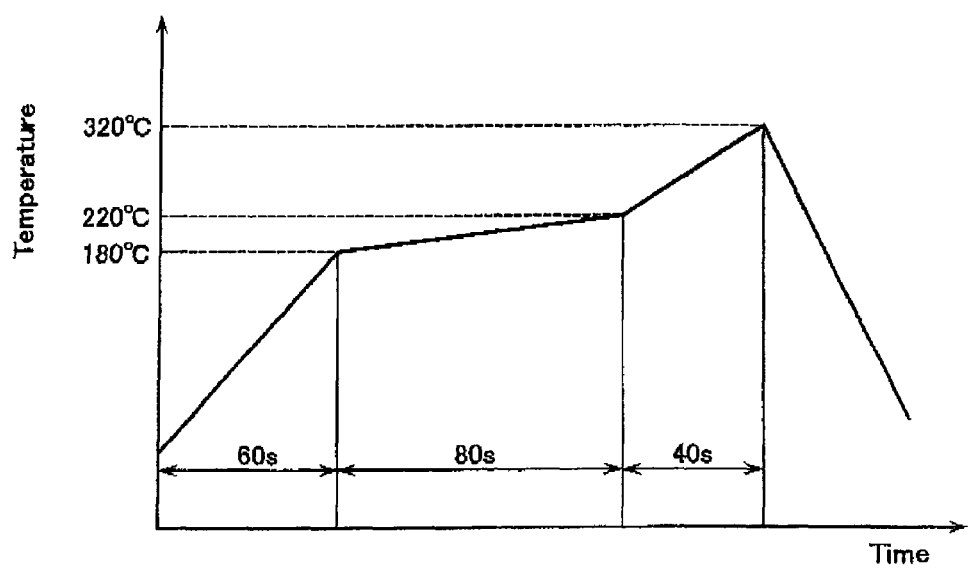
FIG. 25 is a graph exemplifying a temperature profile on solder reflow heating during fabrication of the semiconductor module according to the fifth embodiment.

The mounting board 3 with the chips mounted thereon is passed through a reflow furnace to forms older joints. An example of the temperature profile on reflow heating is shown in FIG. 25. In the heating, the temperature is elevated from room temperature to 180.degree.C. in 60 seconds at a constant rate, then from 180.degree.C. to 220.degree.C. in 80 seconds slowly, and from 220.degree.C. to 320.degree.C. in 40 seconds at a constant rate. Such the profile is employed.

After formation of the solder joints, the mounting board 3 with the solder joints formed thereon is cleaned to remove the flux residue. The mounting board 3 is immersed, for example, into a commercially available flux cleaning solution while an ultrasound of 45 kHz is applied for 10 minutes to clean the flux residue.

Figure 22:
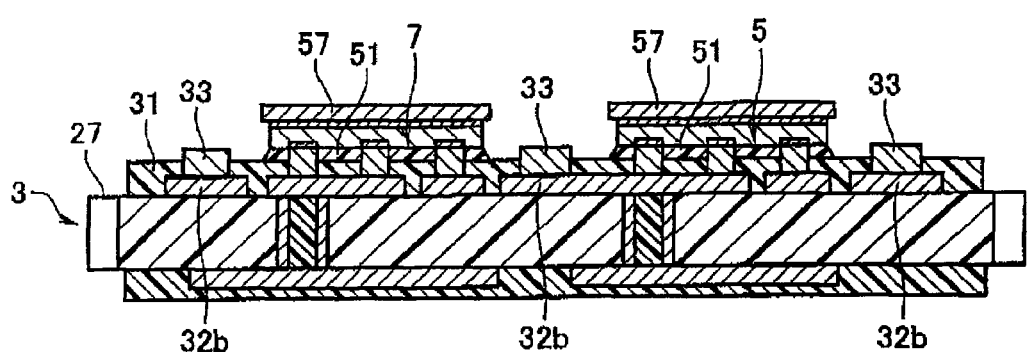
FIG. 22 is a fourth process diagram of the same method.

As shown in FIG. 22, a dispenser is employed to supply an underfill material 51 into spaces between the chips 5, 7, 9 and the mounting board 3. The underfill material 51 is filled in the spaces by the capillary phenomenon. The amount of filler in the underfill material 51 is small in order to facilitate the capillary phenomenon to arise. Therefore, a percentage of the filler in the underfill material 51 is lower than that of the resinous member 61. The underfill material is a resin as well. Accordingly, it can be said that, in the resin member composed of the resinous member 61 and the underfill material 51, the filler contents in the portions located in the spaces between the chips 5, 7, 9 and the mounting board 3 are less than those in other portions.

Thereafter, a thermal treatment is applied to cure the underfill material 51. The above spaces may be filled with a resin for use in later resin sealing. In this method, the underfill material may not be employed if there is no problem about the property and reliability.

A dispense process is applied to supply the connection members 57 and 33 on the lower surfaces of the chips 5, 7, 9 and the electrode 32b. The solder material employed comprises Sn5Pb95 solder having a melting point higher than that of Sn10Pb90 solder of the connection member used in the flip-chip connection. The solder material may include a Sn—Pb—Ag series. The solder material to be supplied has a melting point higher than that of the connection member used in the flip-chip connection. This reason will be described in the later paragraph associated with the primary effect of the fifth embodiment.

Figure 23:
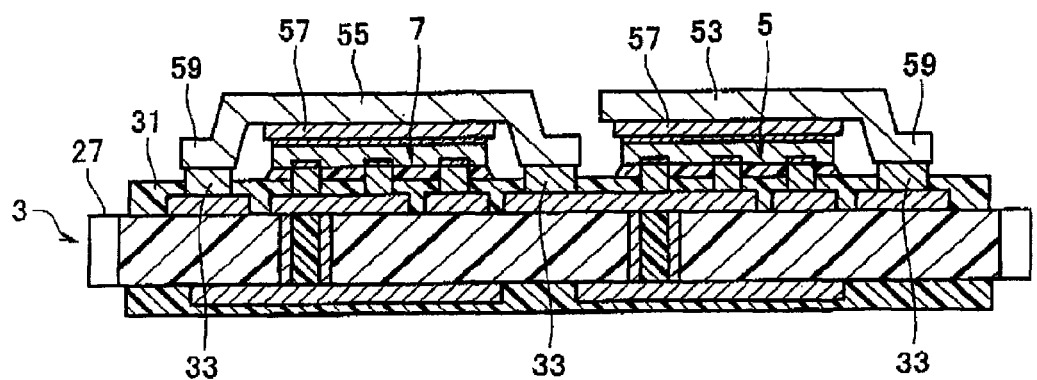
FIG. 23 is a fifth process diagram of the same method.

After the step of FIG. 22, a multi-functional mounter is employed to mount the heat sink members 53, 55 as shown in FIG. 23. A 200 μm thick copper frame is employed as the heat sink members 53, 55.

The mounting board 3 with the heat sink members 53, 55 mounted thereon is passed through a reflow furnace to solder the heat sink members 53 and 55. A heating profile herein is different from the preceding heating profile only in peak temperature and includes heating under the condition of a peak temperature of 330.degree.C. After the reflow, the flux residue is cleaned.

Figure 24:
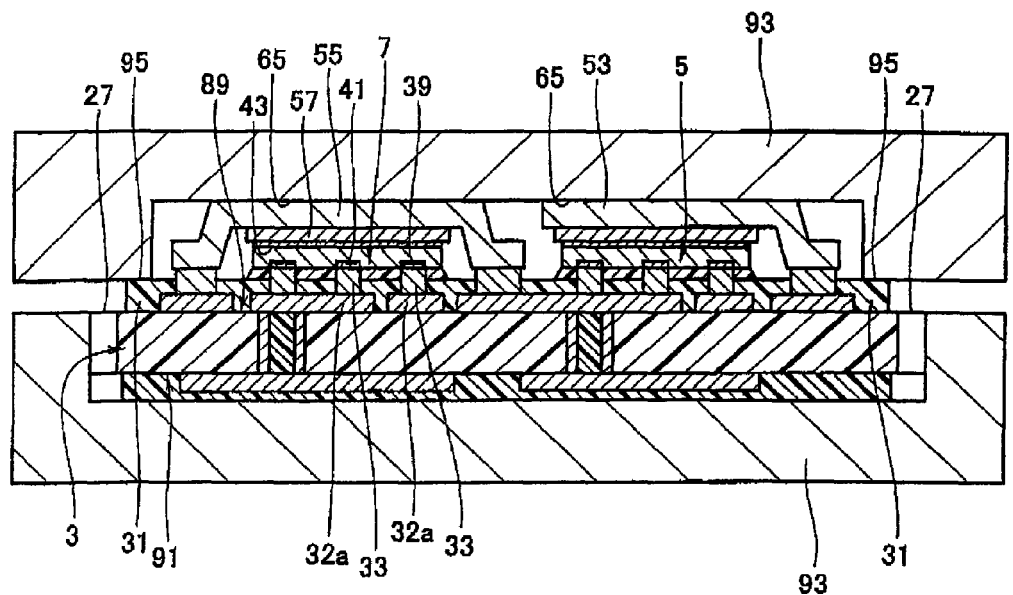
FIG. 24 is a sixth process diagram of the same method.

A molding step is executed as shown in FIG. 24 such that the cleaned mounting board 3 is provided in a mold 93 and a resin is applied to seal the chips 5, 7, 9. Specifically, in the molding step, the cleaned mounting board 3 is provided in the mold 93 held at 180.degree.C., and the resin is filled within the mold 93 in 10 seconds, then held for 60 seconds within the mold 93 to cure the resin. Thereafter, the mounting board 3 with the resin-sealed chips 5, 7, 9 is removed from the mold.

Usually, a number of mounting boards 3 are processed in a single sheet state prior to the molding step. Therefore, dicing or stamping is applied to form individual mounting boards 3 to finally complete the semiconductor module.

Resin leakage may possibly arise on the other surface 65 (the surface exposed to outside) of the heat sink member 53, 55. The resin leakage can be prevented by adhering a tape over whole of the other surface 65 of the heat sink member 53, 55 prior to molding, then molding, and peeling off the tape after the molding.

Primary effects of the fifth embodiment will be described. In the fifth embodiment, edges 95 that define an aperture of the mold 93 entirely make contact with the solder resist 31. In a word, the edge 95 and the facing surface 89 of the mounting board 3 sandwich the solder resist 31 therebetween. The solder resist 31 is relatively flexible so that the edge 95 and the facing surface 89 create no gap therebetween. As a result, the resin can be prevented from leaking to the external terminal 27. The contact between the edge 95 and the solder resist 31 has a width of 100 μm, for example.

As shown in FIG. 24, in the fifth embodiment, the connection member 57 (an example of the first connection member) electrically connects the drain electrode 43 on the lower surface of the power MOS chip 5, 7 with the heat sink member 53, 55. The connection member 33 (the second connection member) electrically connects the gate electrode pad 39 and the source electrode pad 41 on the upper surface of the power MOS chip 5, 7 with the electrode 32a on the mounting board 3. The connection member 57 (the example of the first connection member) is controlled to have a melting point higher than that of the connection member 33 (the second connection member).

The connection members 33, 57 may be composed of the solder material with same composition (that is, the same melting point). In this case, during the reflow of the connection member 57 to connect the drain electrode 43 on the power MOS chip 5, 7 with the heat sink member 53, 55, the temperature is lowered down to room temperature after the molten connection member 57 is solidified. At this stage, a problem may arise on the reliability of the connection member 33 (for example, bump open; the electrode pad 39, 41 being peeled off the connection member 33). This is caused when a distortion remains in the connection member 33 or when the connection member 33 cannot follow the deformation of the heat sink member 53, 55. In a word, as the joint area between the connection member 33 and the electrode pad 39, 41 is small, the above cause leaves bump open.

In the fifth embodiment, the melting point of the connection member 57 is higher than that of the connection member 33. Accordingly, at the stage of lowering the temperature down to room temperature after the molten connection member 57 is solidified, the connection member 33 is not yet solidified. Therefore, the above cause does not arise on the connection member 33 and the bump open can be prevented. As a result, the fifth embodiment is possible to improve the reliability of the connection member 33 and consequently the reliability of the semiconductor package.

The fifth embodiment employs solder as the material of the connection member 33, 57 though it may employ a resin paste that contains a metal powder. Alternatively, it may employ solder as the material of the one connection member and the resin paste as the material of the other connection member.

Figure 26:
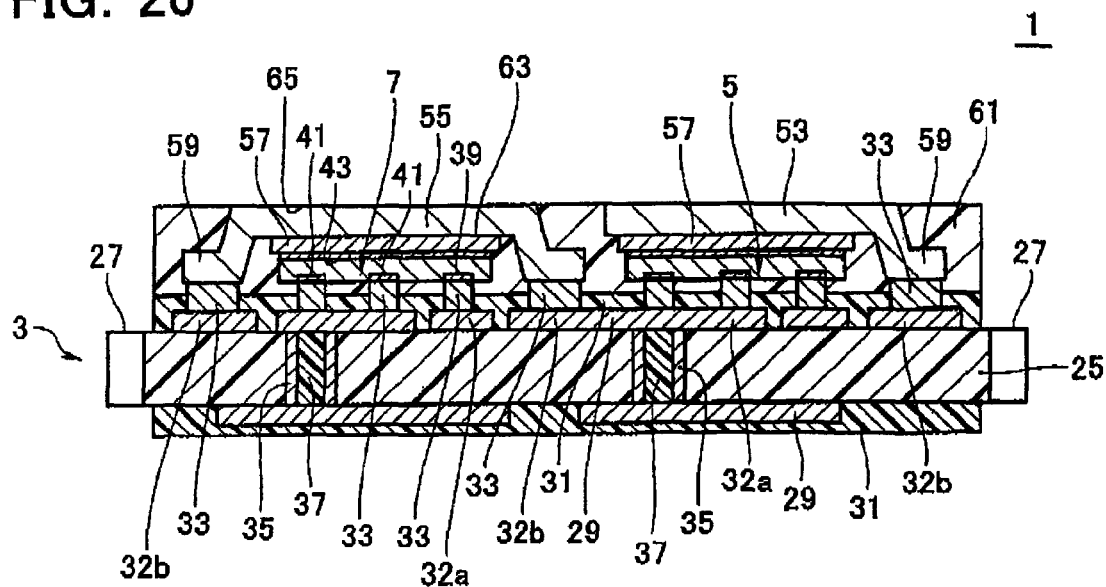
FIG. 26 is a cross-sectional view of a semiconductor module according to an embodiment.
Figure 27:
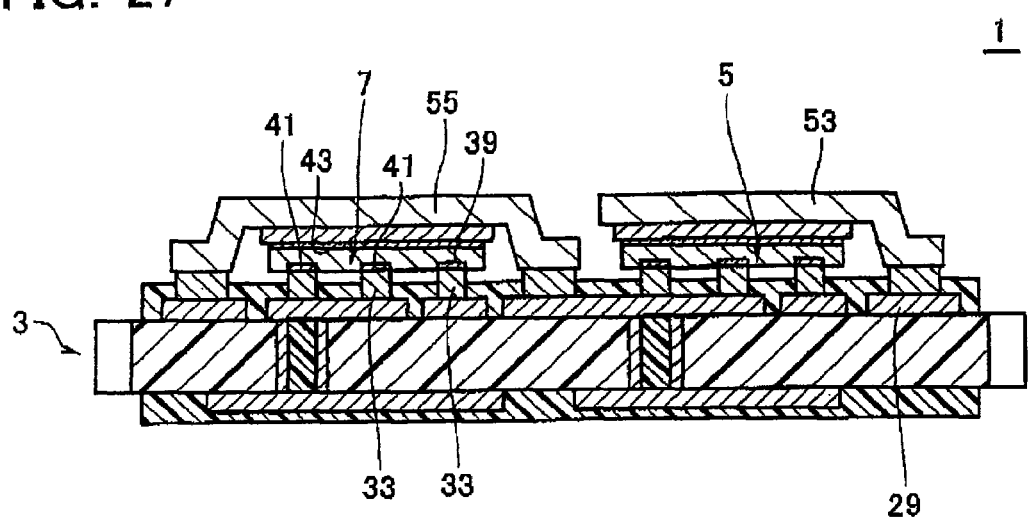
FIG. 27 is a cross-sectional view of a semiconductor module according to another embodiment.
Figure 28:
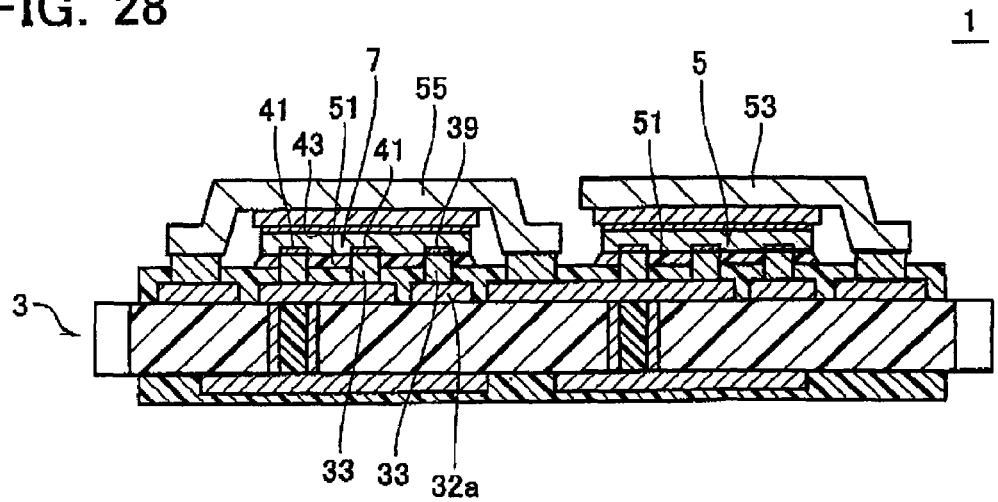
FIG. 28 is a cross-sectional view of a semiconductor module according to yet another embodiment.

The present invention also includes embodiments shown in FIGS. 26-28, which correspond to FIG. 3. In a semiconductor module 1 of FIG. 26, no underfill material 51 is provided in the spaces between the chips 5, 7, 9 and the mounting board 3 and the resinous member 61 is filled in that places instead.

The above spaces are narrow so that the resinous member 61 may not enter the spaces on molding the resinous member 61, leaving air bubbles in the resinous member 61. Therefore, in the semiconductor module 1 of FIG. 3, the underfill material 51 is injected into the spaces prior to molding in order to prevent generation of air bubbles.

Molding the resinous member 61 into the spaces between the chips 5, 7, 9 and the mounting board 3 produces the semiconductor module 1 of FIG. 26. As a result, the step of injecting the underfill material can be omitted.

In a semiconductor module 1 shown in FIG. 27, the resinous member 61 and the underfill material 51 are not provided. This is different from the semiconductor module 1 shown in FIG. 3.

As the resinous member 61 is not provided, the power MOS chips 5, 7, the drive IC chip 9 (not shown) and the heat sink members 53, 55 are entirely exposed. As the underfill material 51 is not provided, spaces are formed between these chips and the mounting board 3.

Even if the resinous member 61 and the underfill material 51 are not provided, nothing may interfere with the use of the semiconductor module depending on the case. In such the case, the semiconductor module 1 of FIG. 27 can be employed. For example, when the mounting board 3 is a ceramic board, the mounting board 3 has a thermal expansion coefficient close to those of the chips 5, 7. Therefore, even when heat radiation from the chips 5, 7 expands the mounting board 3 and the chips 5, 7, the connection member 33 can be prevented from peeling off the electrode pads 39, 41. Thus, the reliability of the connection member 33 does not lower. In the semiconductor module 1 of FIG. 27, the resinous member 61 and the underfill material 51 are not provided and accordingly the cost for manufacturing the semiconductor module can be lowered.

In a semiconductor module 1 of FIG. 28, the underfill material 51 is filled in the spaces between the power MOS chips 5, 7 and the drive IC chip (not shown) and the mounting board 3. This is different from the semiconductor module 1 of FIG. 27. Therefore, only the electrode 32a on the mounting board 3, the connection member 33, and the electrode pads 39, 41 are sealed with resin.

Heat radiation from the chips 5, 7 causes thermal stresses to concentrate on the locations of the gate electrode pad 39 and the source electrode pad 41. The underfill material 51 can prevent the thermal stresses from causing the connection member 33 to peel off the electrode pads 39, 41.

Sixth Embodiment

Figure 29:
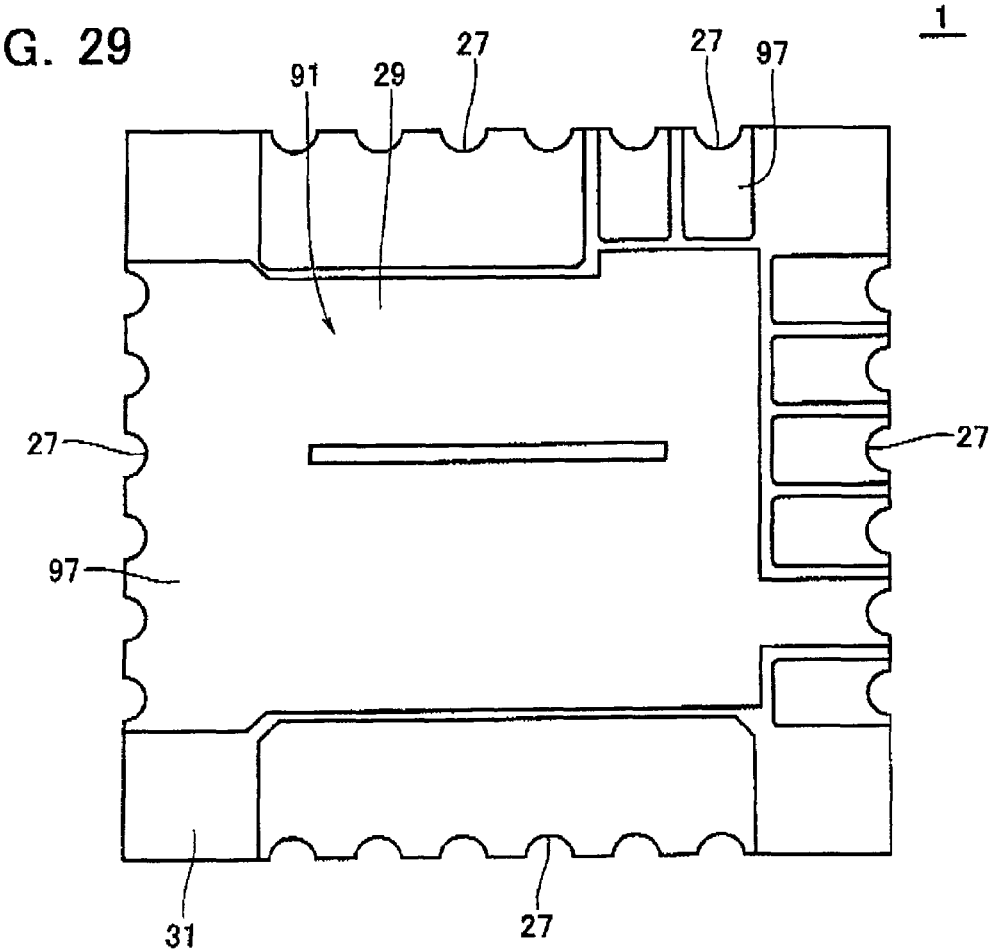
FIG. 29 is a bottom view of a semiconductor module according to a sixth embodiment.
Figure 30:
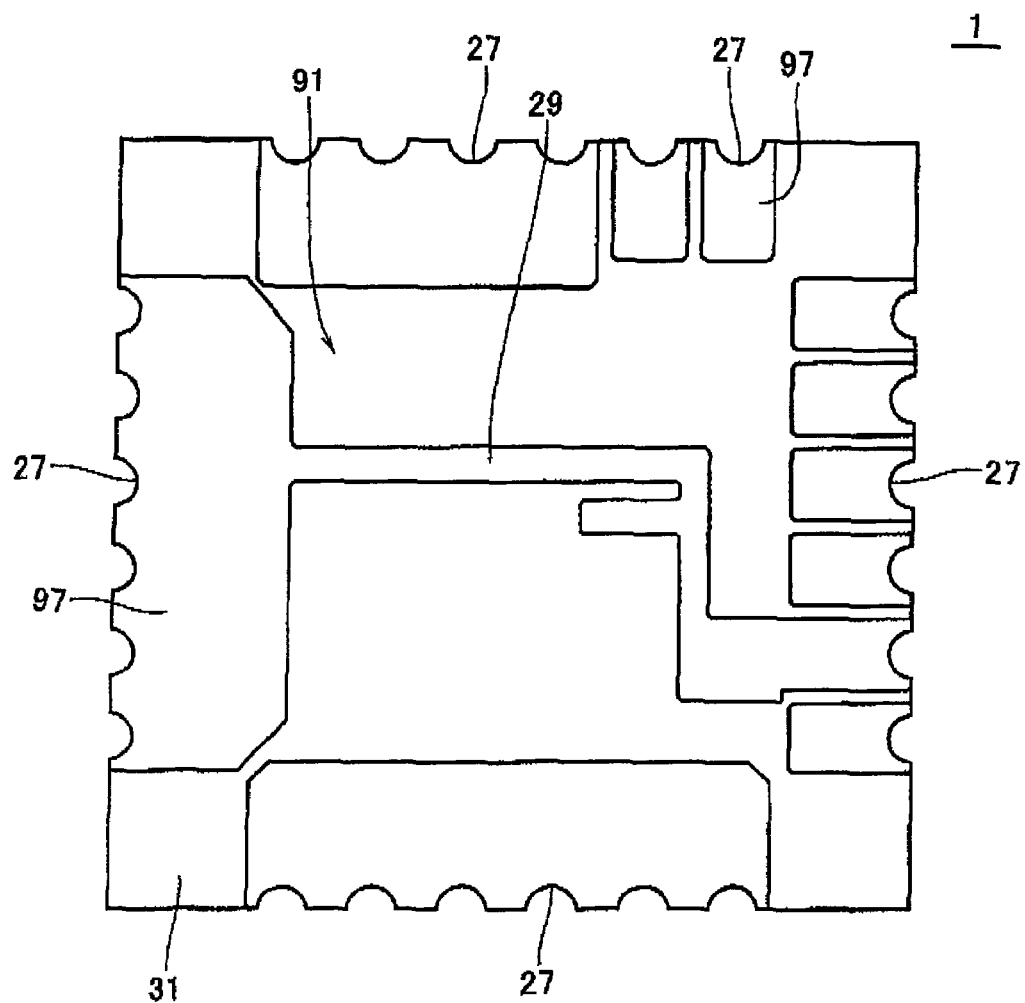
FIG. 30 is a bottom view of a semiconductor module according to the fifth embodiment.

FIG. 29 is a bottom view of a semiconductor module 1 according to a sixth embodiment while FIG. 30 is a bottom view of the semiconductor module 1 according to the fifth embodiment. The bottom corresponds to the opposite surface 91 of the surfaces of the mounting board 3, which locates opposite to the surface facing the chips 5, 7, 9.

In the opposite surface 91, terminal plates 97 are formed extending from the external terminals 27. A terminal plate 97 is connected to a single external terminal 27 only or to multiple external terminals 27 commonly. In the opposite surface 91, wires 29 are formed connecting the terminal plates 97 with each other. The wires 29 and the terminal plates 97 are covered with the solder resist 31. In comparison with the wire 29 on the semiconductor module 1 according to the fifth embodiment of FIG. 30, the wire 29 on the semiconductor module 1 according to the sixth embodiment of FIG. 29 is much wider. The wire 29 in FIG. 29 covers almost the region corresponding to the chips 5, 7, 9 in the opposite surface 91. The wire 29 in FIG. 29 also serves as a step corrective section, which is described below.

Figure 31:
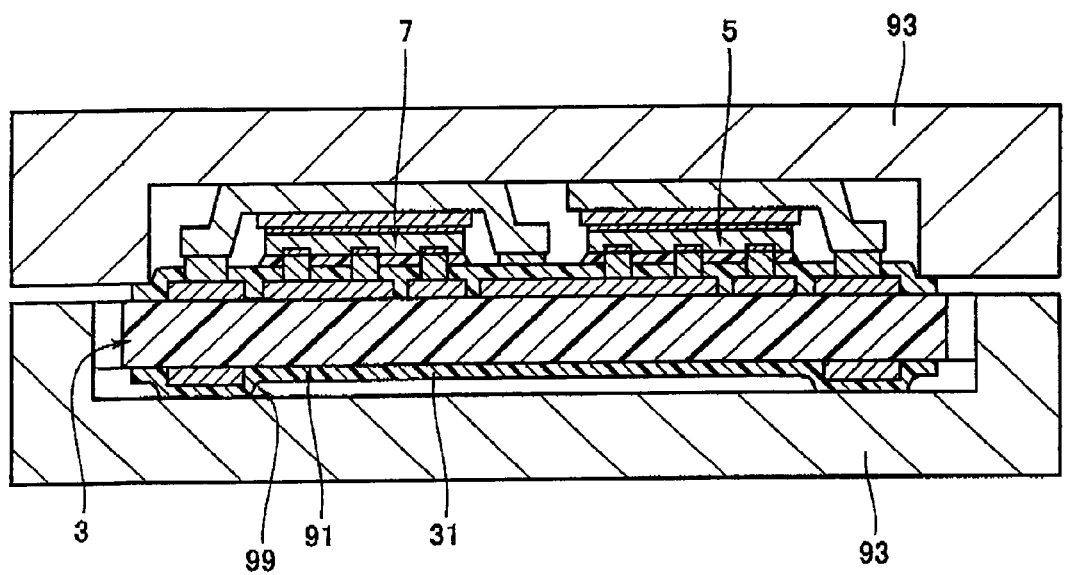
FIG. 31 is a cross-sectional view of a mounting board and so forth housed in a mold prior to resin sealing.

FIG. 31 is a cross-sectional view of the mounting board 3 and so forth housed in the mold 93 prior to resin sealing, corresponding to FIG. 24. In FIG. 24 no step is formed in the opposite surface 91 while a step 99 is formed in practice as shown in FIG. 31 for the following reason. As shown in FIG. 30, for the wire 29 and the terminal plate 97, formation portions and non-formation portions are present in the opposite surface 91. In this case, the solder resist 31 located on the non-formation portions differs in height from the solder resist 31 located on the formation portions. The wire 29 and the terminal plate 97 have a thickness of 35 μm, for example, which makes the step 99 about 35 μm thick.

Figure 32:
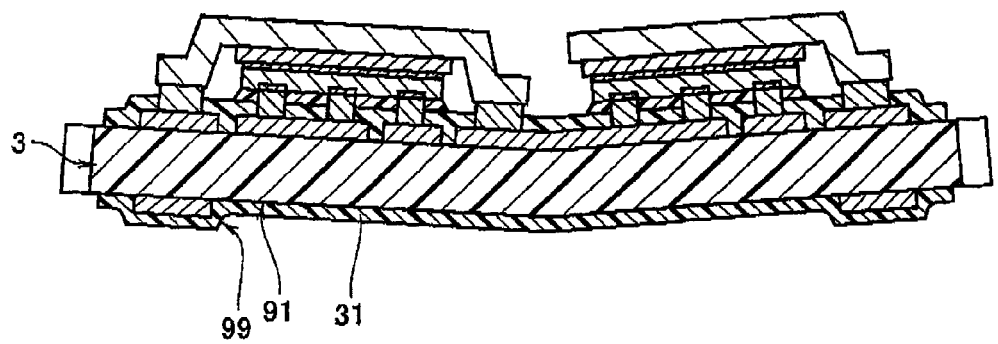
FIG. 32 shows the mounting board deflected.

On molding in the presence of the step 99, pressure of the resin injected into the mold 93 distorts the mounting board 3 within the mold 93 as shown in FIG. 32 and causes bump open and so forth, which lower the reliability of the semiconductor module. Even the step 99 about 18 μm thick may cause such the problem.

To the contrary, in the semiconductor module 1 according to the sixth embodiment of FIG. 29, the wire 29 also serves as the step corrective section to prevent the occurrence of the step in the solder resin 31. As a result, the above distortion is prevented from arising on molding and the reliability of the semiconductor module can be improved accordingly.

Figure 33:
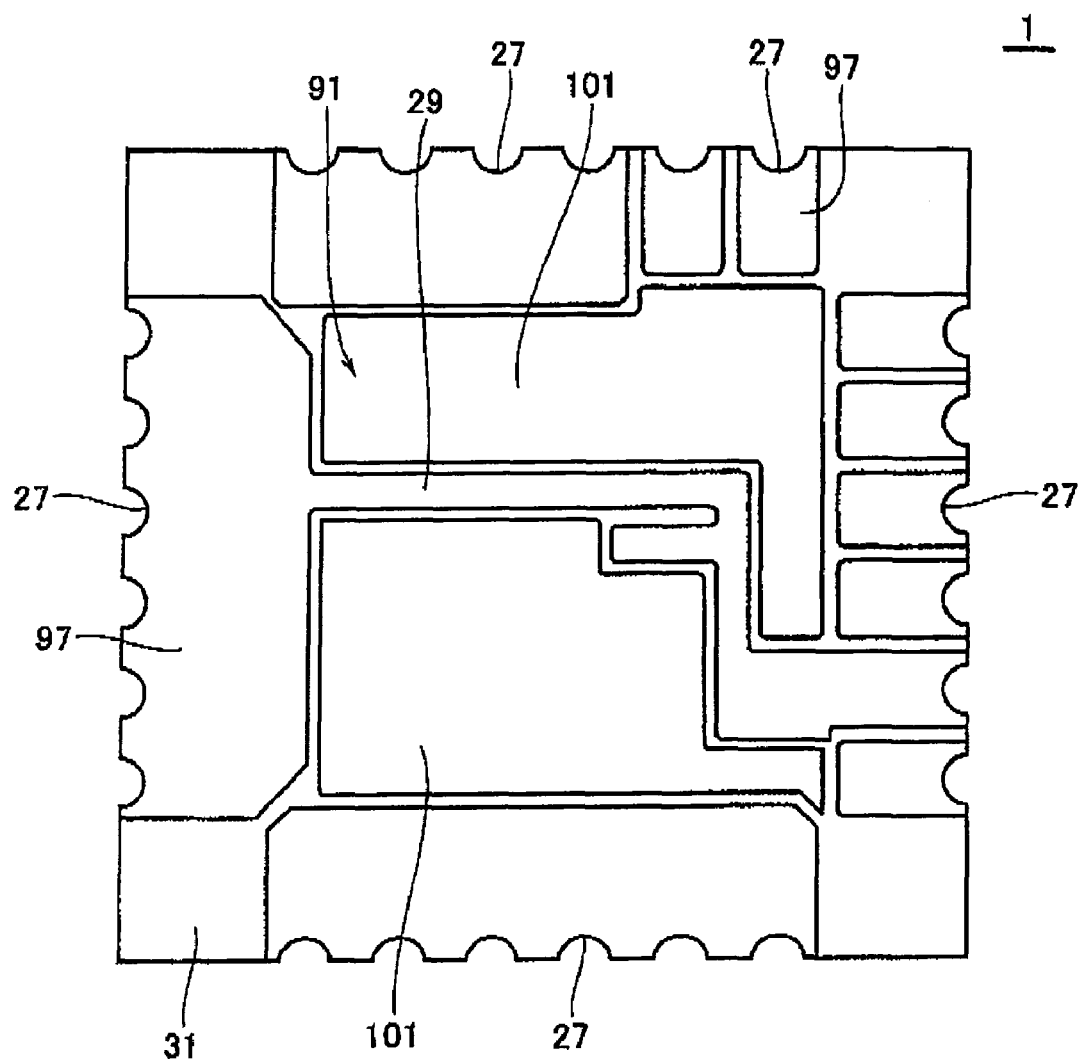
FIG. 33 is a bottom view of a modification of the semiconductor module according to the sixth embodiment.

Like in a modification of the sixth embodiment shown in FIG. 33, a dummy wire 101 may be formed in the step corrective section. The dummy wire 101 is formed at the same time with the wire 29 and has the same thickness as that of the wire. Therefore, the dummy wire 101 can also prevent the occurrence of the step in the solder resin 31. The dummy wire 101 is not connected to any wires.

Seventh Embodiment

Figure 34:
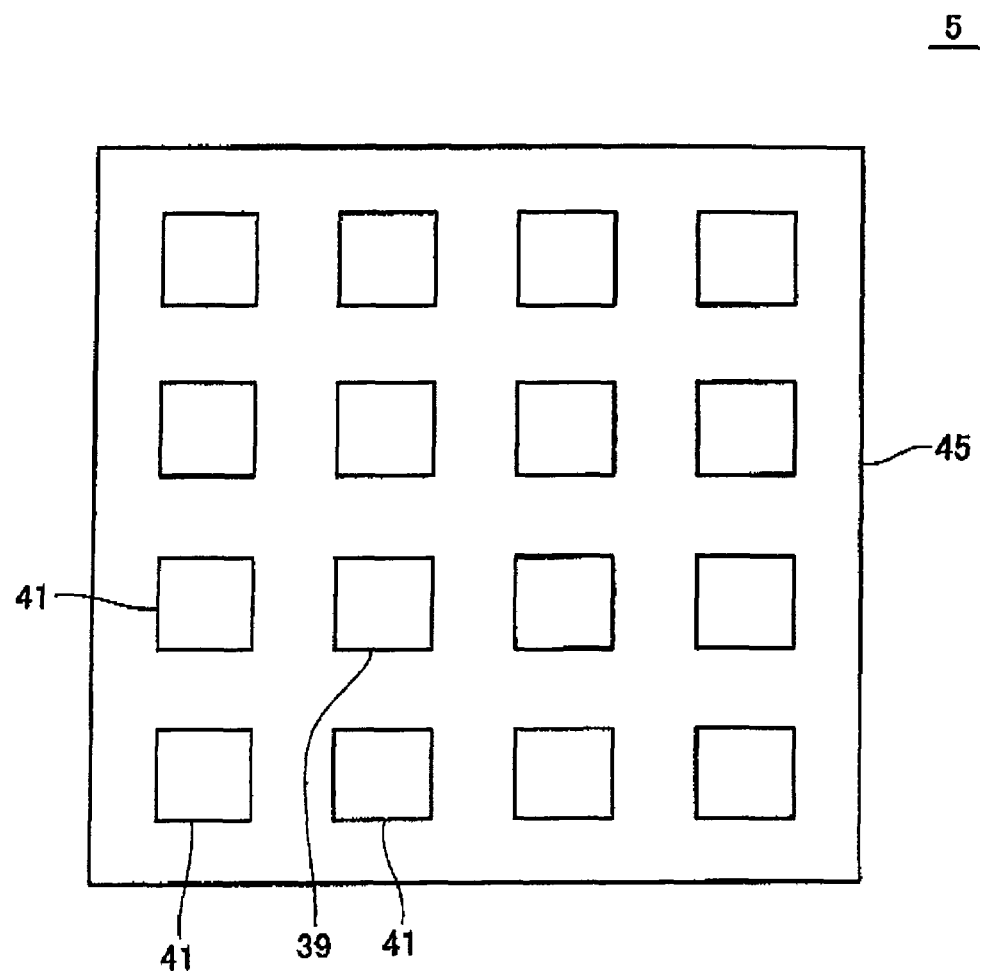
FIG. 34 is a plan view of an upper surface of a power MOS chip provided in a semiconductor module according to a seventh embodiment.

FIG. 34 is a plan view of an upper surface 45 of the power MOS chip 5 provided in a semiconductor module according to a seventh embodiment. In the upper surface 45, a single gate electrode pad 39 and a number of source electrode pads 41 are formed. The gate electrode pad 39 serves as a lead electrode from the trench gate 17 of FIG. 4. The source electrode pads 41 serves as lead electrodes from the source electrodes 24 of FIG. 4, which are an example of the first main electrodes. In this embodiment, the drain electrode 43 of FIG. 4 is the second electrode.

The heat on molding extends the mounting board 3. The influence from the extension becomes lager as closing to the corner. Therefore, the electrode pad located in the corner is easily made bump open due to thermal stresses. Normally, the gate electrode pad 39 is formed at the corner in the upper surface 45. As the gate electrode pad 39 is single, an occurrence of bump open results in a failed semiconductor module.

In the seventh embodiment, a source electrode pad 41 is formed around the gate electrode pad 39. Therefore, the gate electrode pad 39 is not located in the corner and it is possible to prevent thermal stresses from causing bump open associated with the gate electrode pad 39.

Eighth Embodiment

Figure 35:
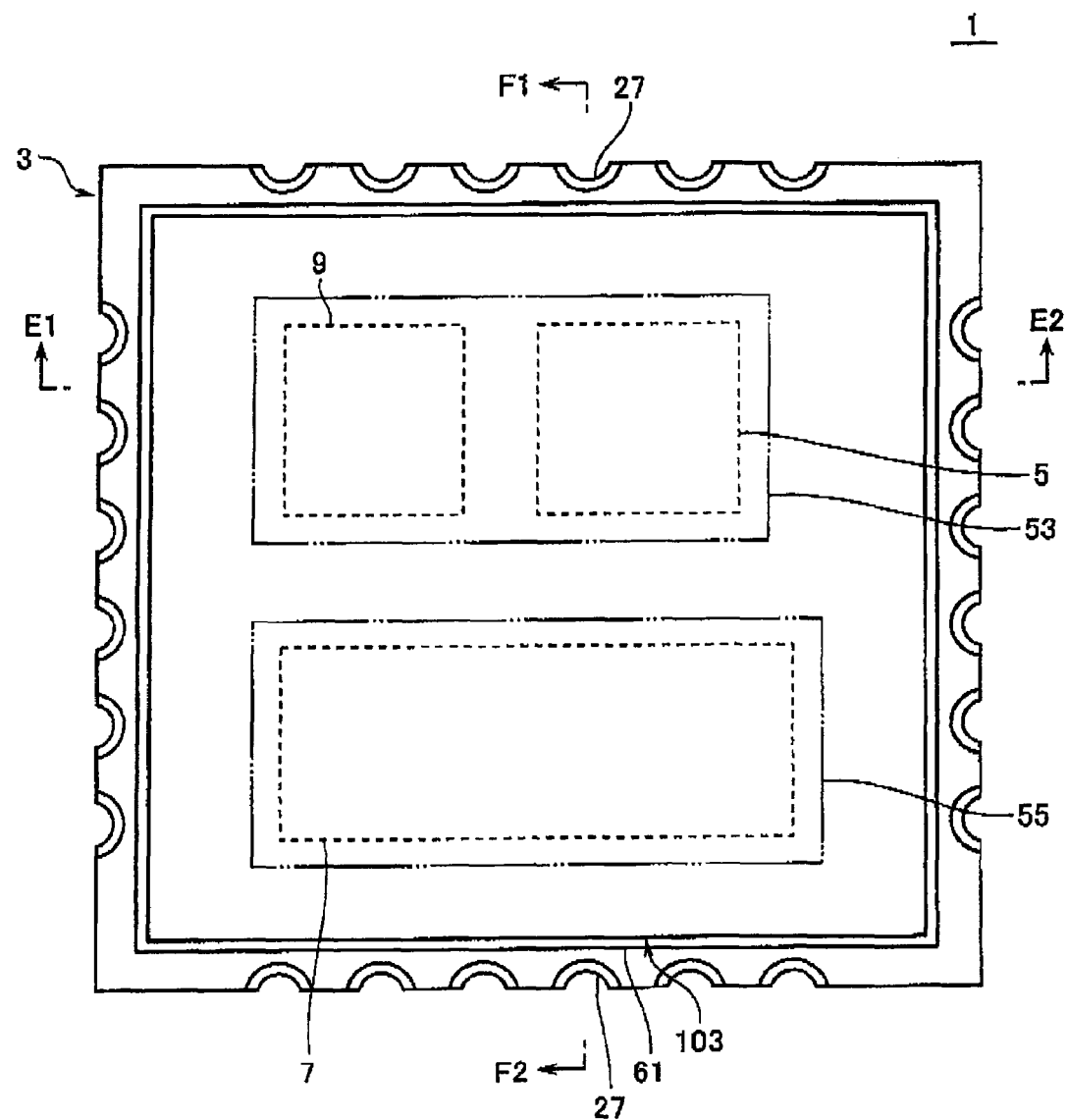
FIG. 35 is a plan view of a semiconductor module according to an eighth embodiment.
Figure 36:
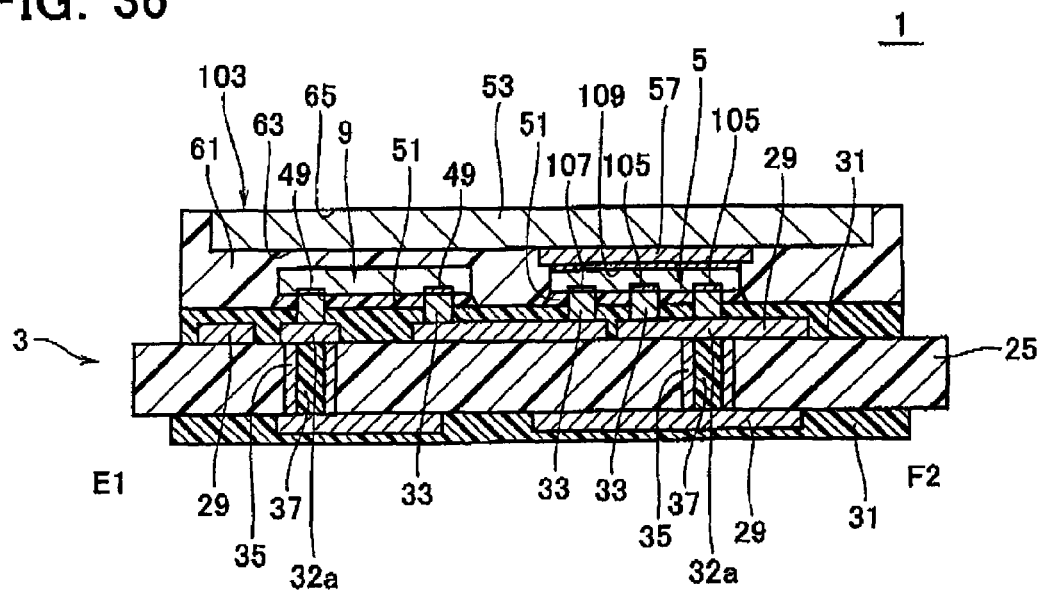
FIG. 36 is a cross-sectional view taken along E1-E2 line in FIG. 35.
Figure 37:
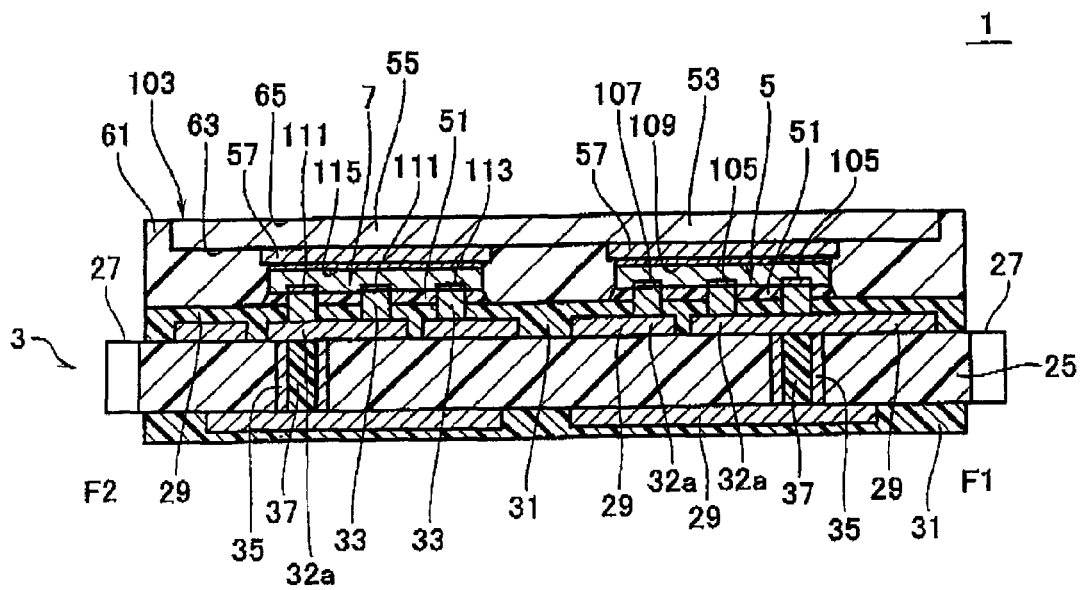
FIG. 37 is a cross-sectional view taken along F1-F2 line in FIG. 35.

FIG. 35 is a plan view of a semiconductor module 1 according to an eighth embodiment. FIG. 36 is a cross-sectional view taken along E1-E2 line in FIG. 35 while FIG. 37 is a cross-sectional view taken along F1-F2 line in FIG. 35. The eighth embodiment differs from the second embodiment of FIG. 8 mainly in that the heat sink members 53 and 55 are linked to each other to configure a single heat sink plate 103.

The power MOS chip 5 (an example of the first power MIS chip) has an upper surface with a drain electrode pad 105 and a gate electrode pad 107 formed thereon and a lower surface with a source electrode 109 formed thereon. On the other hand, the power MOS chip 7 (an example of the second power MIS chip) has a source and a drain arranged inversely in comparison with the power MOS chip 5. In a word, the power MOS chip 7 had an upper surface with a source electrode pad 111 and a gate electrode pad 113 formed thereon and a lower surface with a drain electrode 115 formed thereon.

Figure 38:
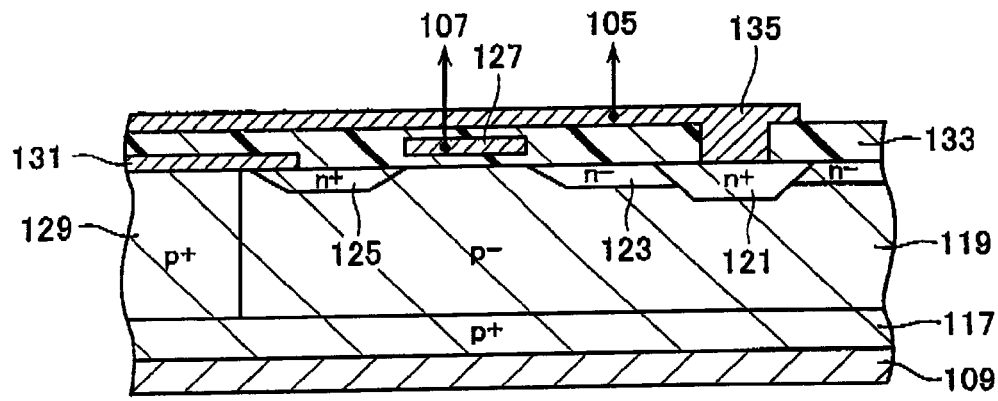
FIG. 38 is a cross-sectional view of part of a power MOS chip 5 according to the eighth embodiment.

The following description is given to the respective structures of the power MOS chips 5, 7 according to the eighth embodiment. FIG. 38 is a cross-sectional view of part of the power MOS chip 5 according to the eighth embodiment. The chip 5 comprises a silicon substrate 117 and an epitaxial layer or p$^-$-type base region 119 formed thereon. The silicon substrate 117 serves as a p$^+$-type source region. The silicon substrate 117 has a lower surface entirely in contact with a source electrode 109.

In the base region 119, an n$^+$-type drain region 121 and an n$^-$-type drift region 123 are formed adjacent to each other. An n$^+$-type source region 125 is formed in the base region 119 apart from the drift region 123, interposing an interval therebetween. A gate 127 is formed on a gate oxide film above a location between the drift region 123 and the source region 125. The gate 127 is operative to form a channel in the base region 119. Through the channel and the drift region 123, the drain region 121 and the source region 125 are brought into conduction.

Adjacent to the source region 125, a p$^+$-type conductive region 129 is formed passing through the base region 119 and reaching the silicon substrate 117. The conductive region 129 and the source region 125 are electrically connected with each other via a short electrode 131. Thus, the source region 125 and the base region 119 are short-circuited.

An interlayer insulator 133 is formed covering the gate 127 and the short electrode 131. A drain electrode 135 is formed on the interlayer insulator 133. The drain electrode 135 makes contact with the drain region 121 via a contact hole formed through the interlayer insulator 133.

Figure 39:
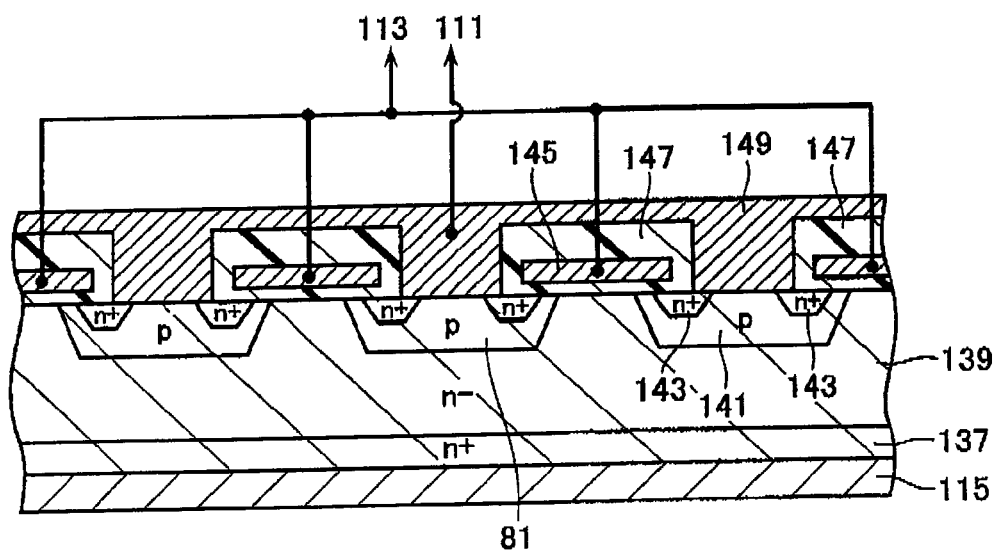
FIG. 39 is a cross-sectional view of part of a power MOS chip 7 according to the eighth embodiment.

The power MOS chip 5 having the above structure is of the so-called lateral type that allows current to flow in a direction parallel to the upper surface of the chip. To the contrary, the power MOS chip 7 is of the so-called vertical type that allows current to flow in a direction perpendicular to the upper surface of the chip. FIG. 39 is a cross-sectional view of part of the power MOS chip 7 according to the eighth embodiment. The chip 7 includes an n$^+$-type silicon substrate 137 and an epitaxial layer or n$^-$-type drift region 139 formed thereon. The silicon substrate 137 serves as an n$^+$-type drain region. The silicon substrate 137 has a lower surface entirely brought into contact with the drain electrode 115. The drift region 139 has a current path extending in a direction perpendicular to the upper surface of the silicon substrate 137.

A plurality of p-type base regions 141 are formed at intervals in the drift region 139. In each base region 141, n$^+$-type source regions 143 are formed spaced from each other. A gate 145 is formed on a gate oxide film between the base regions 141. The gate 145 is operative to form a channel in the base region 141. Through the channel, the source region 143 and the drain region 139 are brought into conduction.

An interlayer insulator 147 is formed covering the gate 145. A source electrode 149 is formed on the interlayer insulator 147. The source electrode 149 makes contact with the source region 143 and the base region 141 via a contact hole formed through the interlayer insulator 147.

As shown in FIG. 3, in the preceding embodiments, the source electrode pad 41 on the power MOS chip 5 is connected to the drain electrode 43 on the power MOS chip 7 via the connection member 33, the wire 29, the connection member 33, the terminal 59 and the heat sink member 55. To the contrary, in the eighth embodiment, the source electrode pad 109 on the power MOS chip 5 is connected to the drain electrode 115 on the power MOS chip 7 via the heat sink plate 103. Therefore, the eighth embodiment is possible to shorten the current path to reduce the wire resistance and reduce the parasitic inductance on the current path. Accordingly, it is possible to provide a high-efficiency electronic device (such as a DC-DC converter) that incorporates the semiconductor module according to the eighth embodiment therein.

Ninth Embodiment

Figure 40:
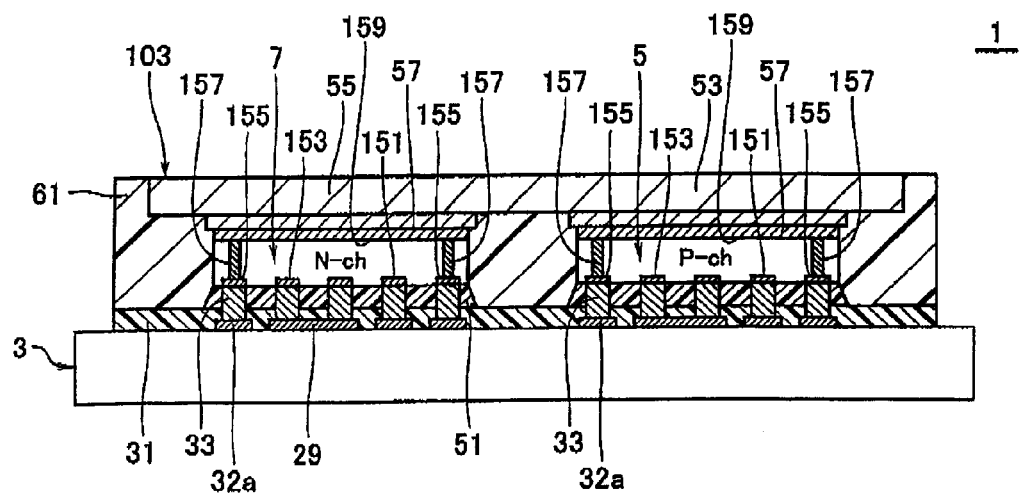
FIG. 40 is across-sectional view of a semiconductor module according to a ninth embodiment.

FIG. 40 is a cross-sectional view of a semiconductor module 1 according to a ninth embodiment, from which the sectional structure and the structure of the lower surface of the mounting board 3 are omitted. The semiconductor module 1 according to the ninth embodiment is similar to the semiconductor module 1 according to the eighth embodiment shown in FIGS. 35-37 because the heat sink members 53, 55 are liked together to configure a single heat sink plate 103. The lower surfaces of the power MOS chips 5, 7 are electrically connected to each other via the heat sink plate 103.

On the other hand, the power MOS chips 5, 7 according to the ninth embodiment differ in structure from those according to the eighth embodiment. The power MOS chip 5 is of the P-channel type while the power MOS chip 7 is of the N-channel type. On the upper surface of the power MOS chip 5, 7, a gate electrode pad 151, a source electrode pad 153 and a drain electrode pad 155 are formed. A connection conductor 157 is formed through the chip 5, 7. The drain electrode pad 155 is electrically connected to a drain electrode 159 on the lower surface of the chip 5, 7 via the connection conductor 157. The electrode pads 151, 153, 155 are connected to the electrode 32a on the mounting board 3 by the connection member 33. The electrode pads 151, 153, 155 may be provided with a bump electrode formed thereon. In this case, the electrode pads 151, 153, 155 are connected to the electrode 32a via the bump electrode and the connection member 33.

In the ninth embodiment, the output VOUT from the semiconductor module 1 shown in FIG. 5 can be led out through the following two current paths. One is a current path including the heat sink plate 103, the terminal of the heat sink member, and the wire on the mounting board 3. Another is a current path including the heat sink plate 103, the connection conductor 157, the drain electrode pad 155, the connection member 33, and the wire on the mounting board 3.

As the drain electrode pad 155 is formed on the upper surface of the power MOS chip 5, 7 the heat sink plate 103 may be isolated from the chip 5, 7. Alternatively, the heat sink plate 103 itself may be composed of an insulator. In these cases, it is possible to omit measures for insulation of the heat sink plate 103 from outside, which otherwise the user must implement, if required. In additional, it is possible to suppress EMI or the like. Such the insulation reduces the wire resistance and inductance even though both the power MOS chips 5, 7 are of the N-channel type. In these cases, the drain electrodes 159 on the power MOS chips 5, 7 are electrically connected via the wire formed on the mounting board 3.

Figure 41:
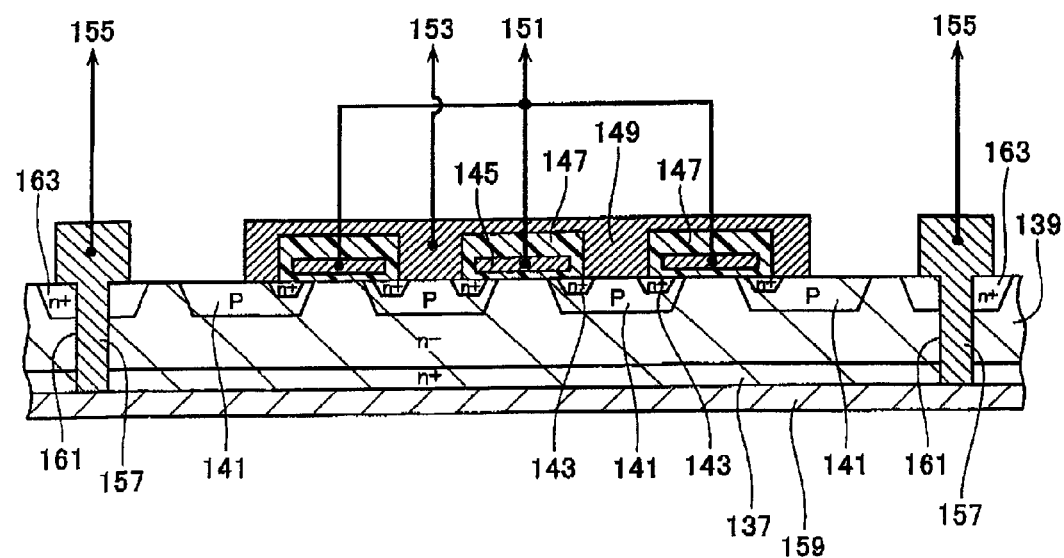
FIG. 41 is a cross-sectional view of part of a power MOS chip provided in the ninth embodiment.

FIG. 41 is a cross-sectional view of part of the power MOS chip 7 provided in the ninth embodiment. The chip 7 has a structure similar to that of the power MOS chip 7 in FIG. 39 except the connection conductor and the vicinity thereof. In the ninth embodiment, the source electrode 153 is an example of the first main electrode while the drain electrode 159 is an example of the second main electrode.

A through-hole 161 is formed in the chip 7 extending from the upper surface to the lower surface of the power MOS chip 7. The through-hole 161 has a diameter of 10 μm or larger. A connection conductor 157 is buried in the through-hole 161. The connection conductor 157 is formed by, for example, plating Cu in the through-hole 161. As the diameter of the through-hole 161 is 10 μm or larger, the connection conductor 157 becomes relatively thick. Therefore, the resistance of the connection conductor 157 can be made smaller than the resistance when the drain electrode is connected to the electrode on the mounting board 3 using a bonding wire or the like instead of the connection conductor 157. The connection conductor 157 makes contact with the drain electrode 159 having a thickness of 5 μm or larger. As the thickness is 5 μm or larger: (1) it can lower the resistance on the current path extending from the n$^+$-type silicon substrate 137 through the drain electrode 159 to the connection conductor 157; and (2) it can be employed as a stopper on formation of the through-hole 161 passing through the silicon layer.

In the upper surface of the power MOS chip 7, an n$^+$-type impurity region 163 is formed surrounding the connection conductor 157. The impurity region 163 prevents a depletion layer extending from the p-base region 141 from reaching the connection conductor 157. In a word, the impurity region 163 keeps non-conduction between the p-base region 141 and the drain electrode 159. This non-conduction may also be kept by formation of an insulating layer on the upper surface of the through-hole 161. In this case, even if the depletion layer reaches the insulating layer on the upper surface of the through-hole 161, conduction between the p-base region 141 and the drain electrode 159 can not be established immediately. Therefore, it is possible to reduce the distance between the through-hole 161 and the p-base region 141 by design and accordingly reduce the chip area. The power MOS chip 5 according to the ninth embodiment has a structure with reverse conduction types of parts in FIG. 41.

In the ninth embodiment, both the drain electrode and the source electrode are led out to the upper surfaces of the chips 5, 7. Accordingly, the distance between the drain electrode and the wire 29 on the mounting board 3 can be shortened to reduce the wire resistance on the current path. On the mounting board 3, the distance between the wire 29 connected to the source electrode and the wire 29 connected to the drain electrode can be shortened to reduce the parasitic inductance on the current path.

In the ninth embodiment the MOSFET is of the planar type though it may be of the trench type. The trench type is possible to lower the resistance of the MOSFET itself so that the resistance of the circuit in the semiconductor module can be lowered further.

Figure 42:
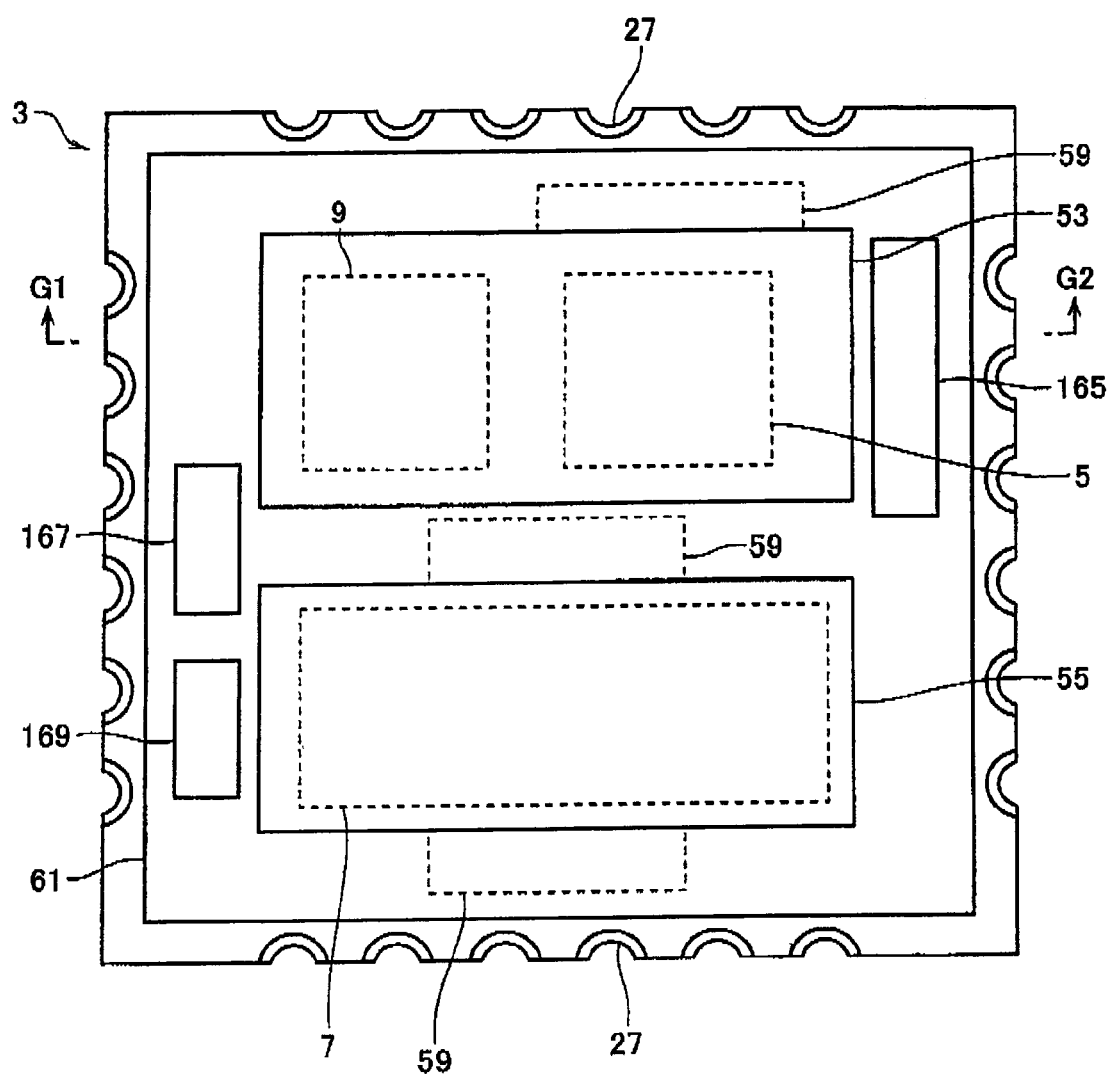
FIG. 42 is a plan view of a semiconductor module according to a tenth embodiment.
Figure 43:
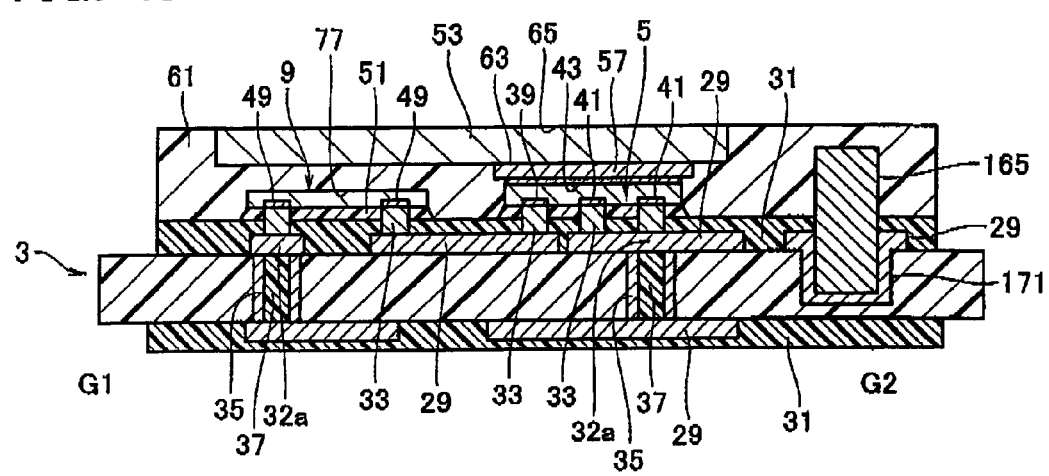
FIG. 43 is a cross-sectional view taken along G1-G2 line in FIG. 42.

The ninth embodiment can shorten the current path, similar to the eighth embodiment. Therefore, it is possible to lower the wire resistance and lower the parasitic inductance on the current path. Accordingly, it is possible to provide a high-efficiency electronic device (such as a DC-DC converter) that incorporates the semiconductor module according to the ninth embodiment therein, Tenth Embodiment FIG. 42 is a plan view of a semiconductor module 1 according to a tenth embodiment and FIG. 43 is a cross-sectional view taken along G1-G2 line in FIG. 42. In the tenth embodiment, in addition to the second embodiment shown in FIG. 8, decoupling condensers 165, 167, 169 (hereinafter also referred to as condensers) are built in the semiconductor module 1. These condensers are operative to cancel the wire inductance between the supply terminals and the ground terminals in the semiconductor module 1 and connected between the supply terminals and the ground terminals.

The condenser 165, 167, 169 may be located on the mounting board 3 while in the structure of the tenth embodiment the condenser 165, 167, 169 is partly embedded in a recess 171 of the mounting board 3 as shown in FIG. 43. As the condenser 165, 167, 169 has relatively large dimensions, if it is located on the mounting board 3, the semiconductor module 1 is structured to protrude from the location of the condenser 165, 167, 169. Formation of the condenser 165, 167, 169 in the recess 171 can lower the height of the location such that the heat sink members 53, 55 can extend over the condensers 165, 167, 169. Therefore, it is possible to enlarge the area of the heat sink member 53, 55 to improve the heat radiation.

Figure 44:
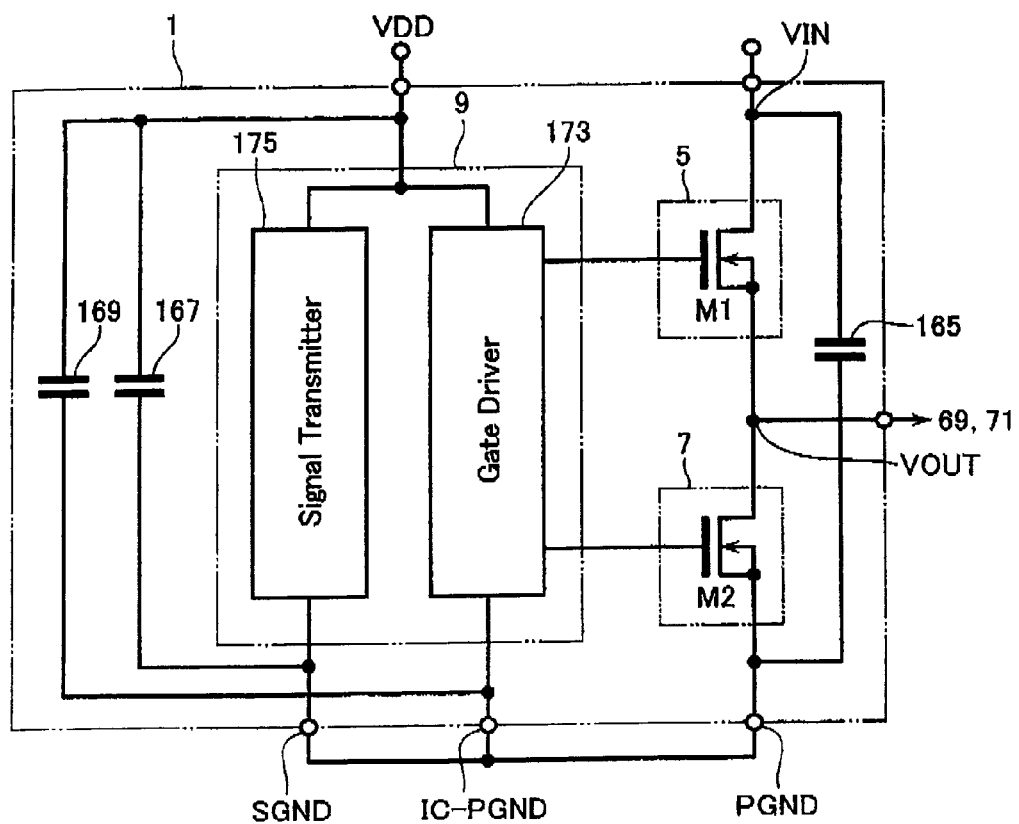
FIG. 44 is a circuit diagram of a semiconductor module according to the tenth embodiment.
Figure 45:
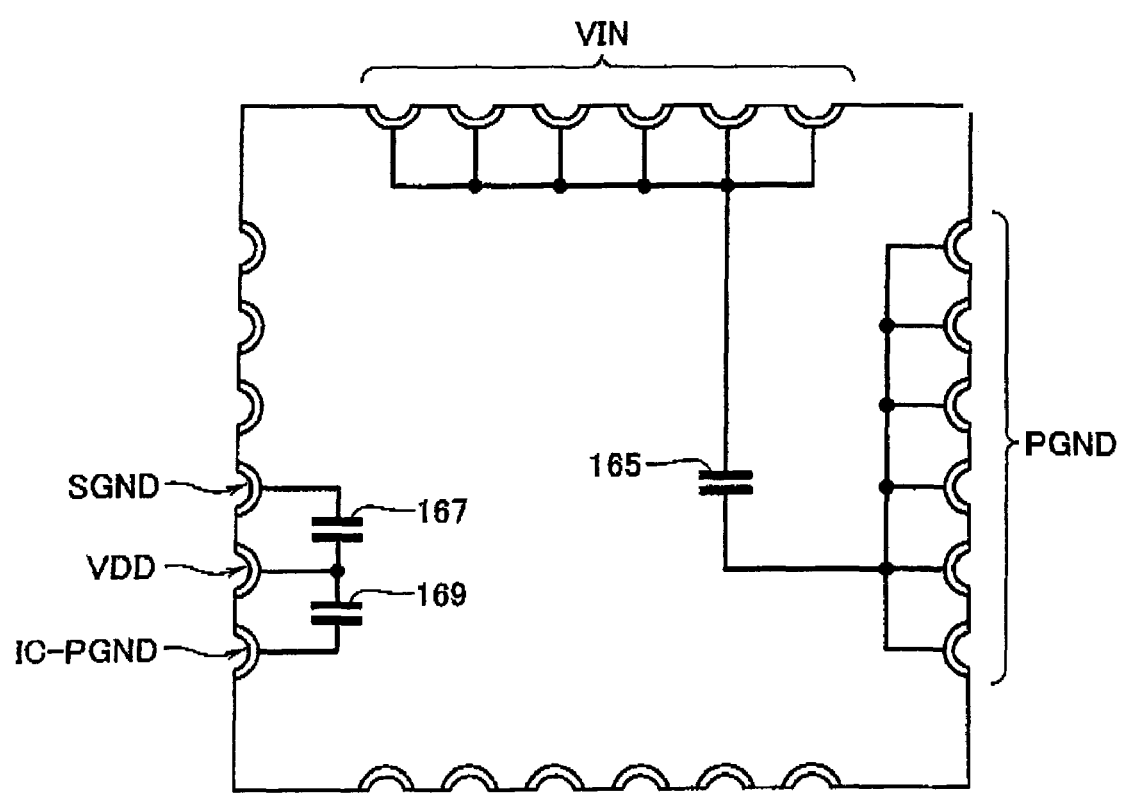
FIG. 45 shows external terminals related to condensers on the semiconductor module according to the tenth embodiment.

The following description is given to the supply terminals and the ground terminals connected to the condensers 165, 167, 169. FIG. 44 is a circuit diagram of the semiconductor module 1 according to the tenth embodiment. FIG. 45 shows external terminals related to condensers on the semiconductor module 1 according to the tenth embodiment. The tenth embodiment provides three decoupling condensers instead of sharing one for the reason described below.

A power IC circuit includes a first block in which large current flows and a second block in which current slightly or hardly flows. Commonality of the ground terminals in the first and second blocks allows large current to flow from the first block to the ground wire in the second block in which current slightly or hardly flows. Accordingly, the second block suffers the influence of the resultant voltage drop. Therefore, the ground terminals are divided between the first block and the second block to prevent the above influence. The ground terminal in the first block is referred to as a PGND (power ground) terminal while the ground terminal in the second block is referred to as a SGND (signal ground) terminal.

The circuit including the power MOS chips 5, 7 corresponds to the first block while the circuit including the drive IC chip 9 corresponds to the second block. Therefore, it is required to provide two condensers. The drive IC chip 9 may also be divided into the first and second blocks. In a word, the drive IC chip 9 can be divided into a gate driver 173 operative to drive the gates of the power MOS chips 5, 7 and a signal transmitter 175 operative to transmit signals from external to the gate driver 173. The signal transmitter 175 has an arithmetic function in addition to the signal transmission. A relatively large current flows in the gate driver 173 while current hardly flows in the signal transmitter 175. Thus, the ground terminal in the gate driver 173 is separated from the ground terminal in the signal transmitter 175.

The ground terminals therefore include three types: the PGND terminal or the ground terminal in the circuit including the power MOS chips 5, 7; an IC-PGND terminal or the ground terminal in the gate driver 173; and the SGND terminal or the ground terminal in the signal transmitter 175. The condenser 165 is connected between a VIN terminal or the supply terminal in the circuit including the power MOS chips 5, 7 and the PGND terminal. The condenser 169 is connected between a VDD terminal or the supply terminal in the gate driver 173 and the IC-PGND terminal. The condenser 167 is connected between the VDD terminal or the supply terminal in the signal transmitter 175 and the SGND terminal.

In the tenth embodiment, the decoupling condensers 165, 167, 169 are contained in the semiconductor module 1. Therefore, the wire connecting the supply terminal with the ground terminal can be made shorter and accordingly the wire inductance can be made lower than when these condensers are connected to the semiconductor module 1 externally.

Eleventh Embodiment

Figure 46:
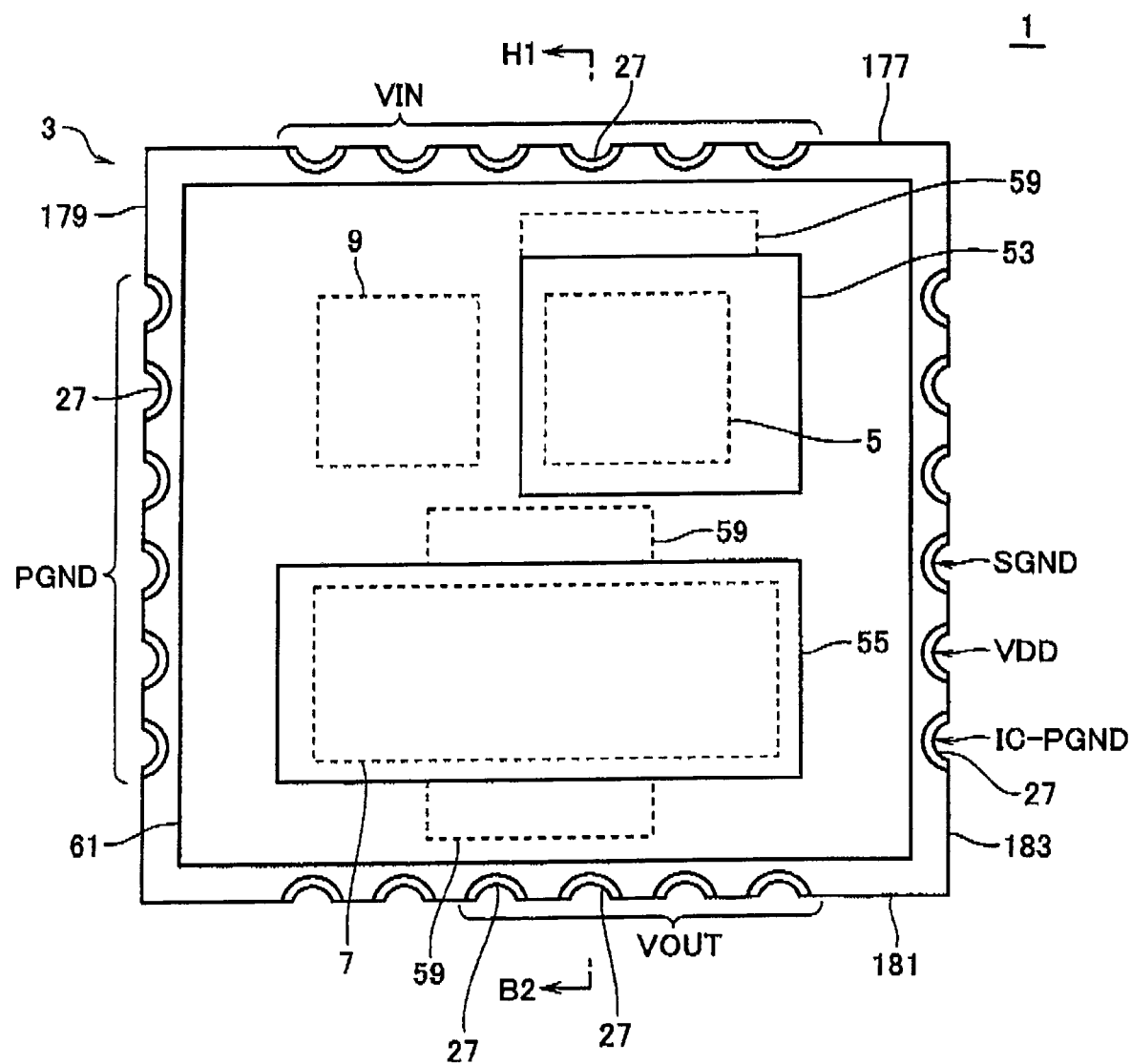
FIG. 46 is a plan view of a semiconductor module according to an eleventh embodiment.
Figure 47:
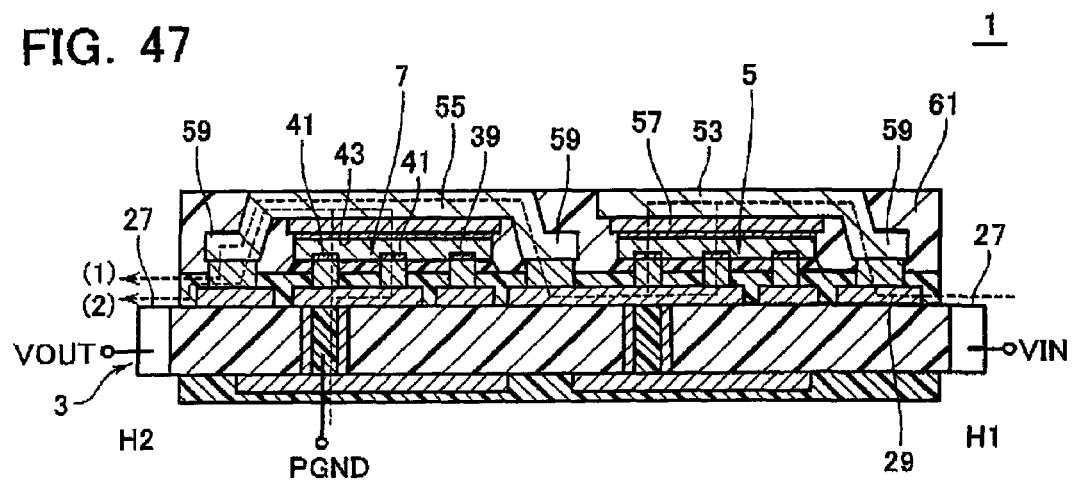
FIG. 47 is a cross-sectional view taken along H1-H2 line in FIG. 46.

FIG. 46 is a plan view of a semiconductor module 1 according to an eleventh embodiment. FIG. 47 is a cross-sectional view taken along H1-H2 line in FIG. 46.

Figure 48:
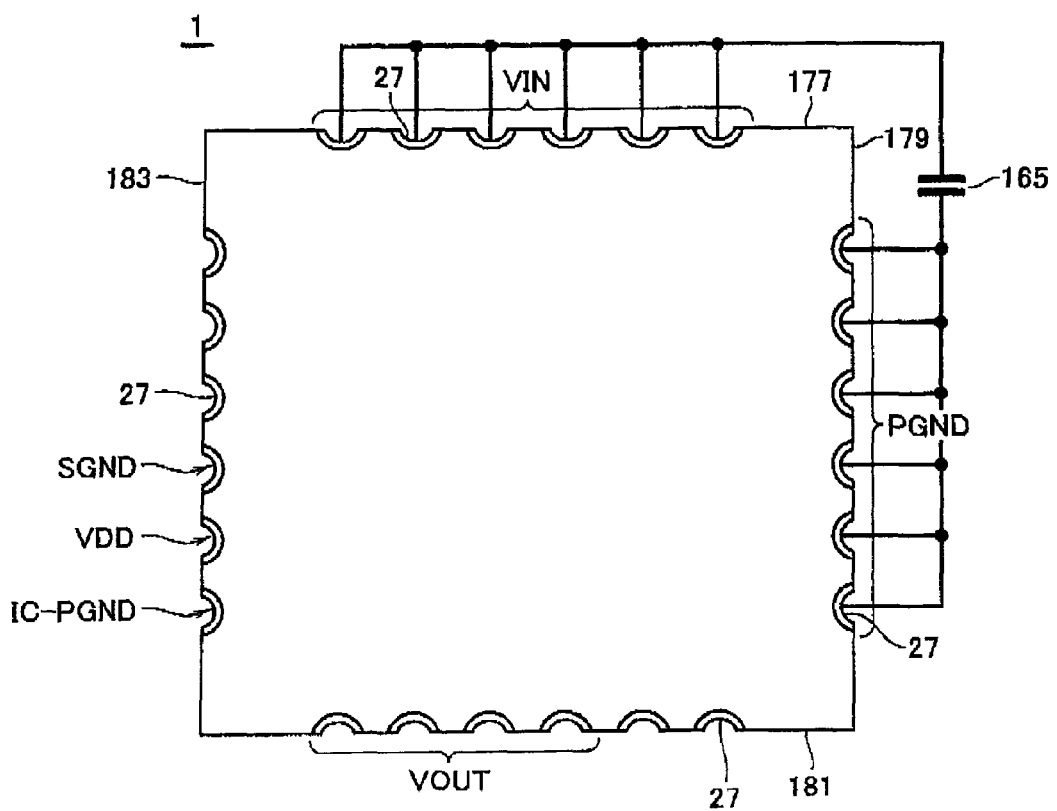
FIG. 48 is a bottom view of the semiconductor module in FIG. 46.

FIG. 48 is a bottom view of the semiconductor module 1 in FIG. 46. The eleventh embodiment further defines the locations of the supply terminals and the ground terminals in the first embodiment shown in FIG. 1.

The external terminals 27 located on a first side 177 of the mounting board 3 are all assigned to the VIN terminal in the circuit including the power MOS chips 5, 7. The external terminals 27 located on a second side 179 adjacent to the first side 177 are all assigned to the PGND terminal in the above circuit. The external terminals 27 located on a third side 181 opposite to the first side 177 of the mounting board 3 are partly assigned to the VOUT terminal shown in FIG. 44. The external terminals 27 located on the remaining final fourth side 183 are assigned to the IC-PGND terminal, the VDD terminal, the SGND terminal and others. These terminals are described earlier in the tenth embodiment.

Different from the tenth embodiment, in the eleventh embodiment, the decoupling condensers are attached to the semiconductor module 1 externally. For example, as shown in FIG. 48, the decoupling condenser 165 is externally connected between the VIN terminal and the PGND terminal.

The VIN terminal is located on the first side 177 while the PGND terminal is located on the second side 179. In a word, these terminals are located on two adjacent sides. Therefore, even if the decoupling condenser is externally connected, the wire connecting the VIN terminal with the PGND terminal can be shortened to reduce the wire inductance.

There are two current paths in the circuit including the chips 5, 7 as shown in FIG. 47. One is a current path (1) of VIN terminal→VOUT terminal while another is a current path (2) of PGND terminal→VOUT terminal.

As the VOUT terminal is located on the third side 181, the current path (1), (2) can be made shorter than when located on the fourth side 183. Three terminals 59, provided in the circuit including the chips 5, 7, are aligned inline. Therefore, the current path (1) can be made shorter. In the rectangular chip 7, the terminals 59 are located on two opposite longer sides. Therefore, the current path (1) can be made shorter than when located on two opposite shorter sides.

As described above, the eleventh embodiment is possible to shorten the wire connecting the VIN terminal with the PGND terminal and shorten the current path. Accordingly, it is possible to provide a high-efficiency electronic device that incorporates the semiconductor module according to the eleventh embodiment therein.

Twelfth Embodiment

Figure 49:
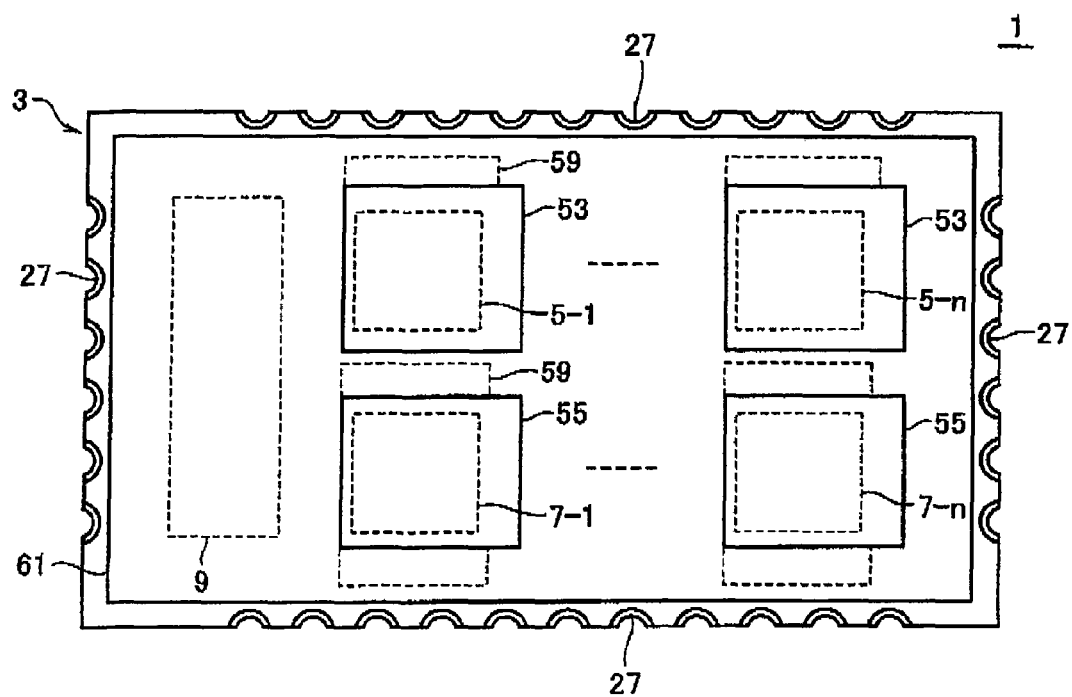
FIG. 49 is a plan view of a semiconductor module according to a twelfth embodiment.

FIG. 49 is a plan view of a semiconductor module 1 according to a twelfth embodiment. The twelfth embodiment is provided with n power MOS chips 5, 7 (chips 5-1 to 5-n and chips 7-1 to 7-n: n is a plurality). Depending on the value of current flowing in the load under the control of the semiconductor module 1, the number of the power MOS chips 5, 7 driven by the drive IC chip 9 is varied. This is a major characteristic.

Figure 50:
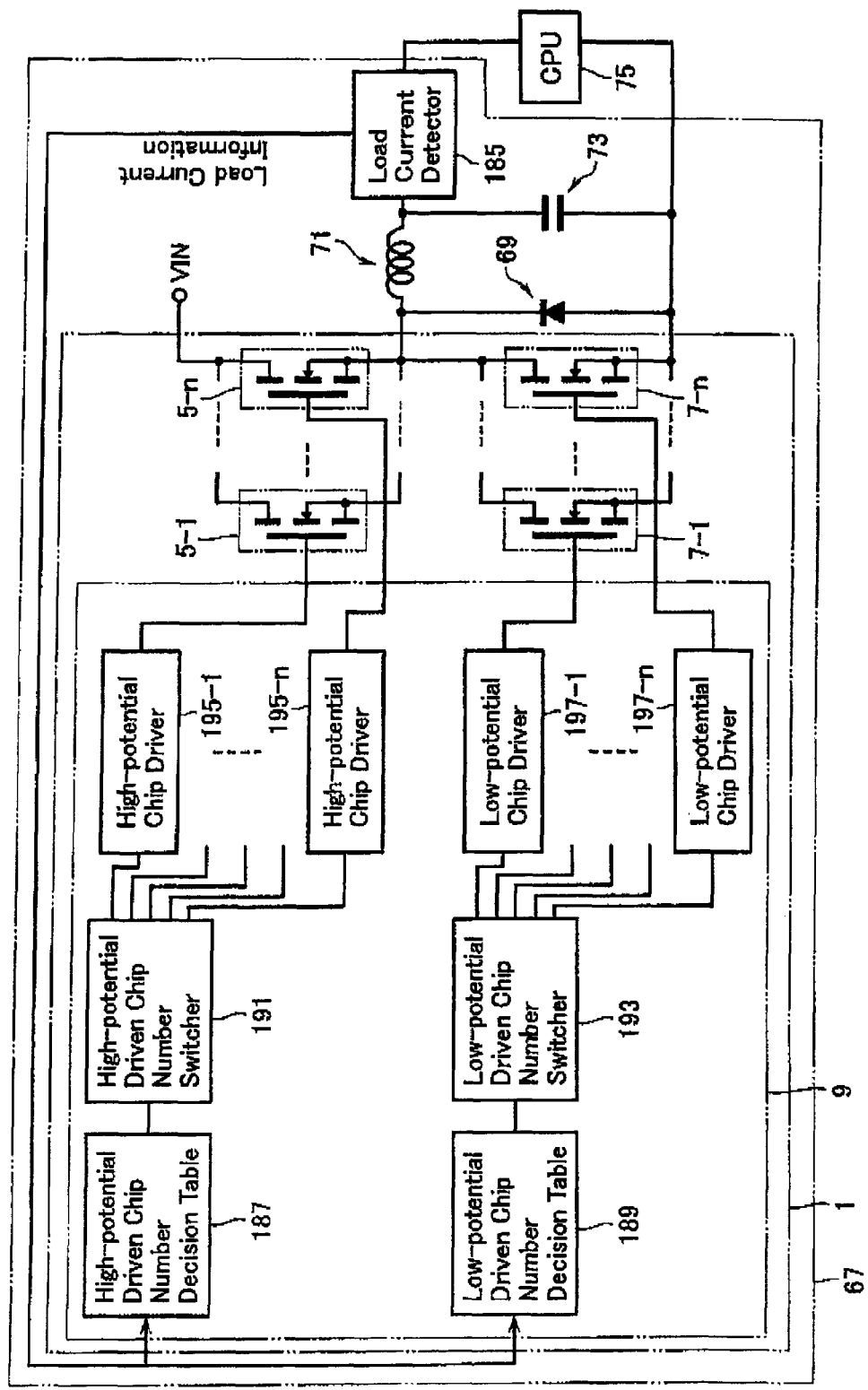
FIG. 50 is a circuit diagram of a DC-DC converter containing the semiconductor module according to the twelfth embodiment.

FIG. 50 is a circuit diagram of a DC-DC converter 67 containing the semiconductor module 1 according to the twelfth embodiment. The DC-DC converter 67 of FIG. 50 further comprises a load current detector 185 operative to detect current flowing in the load CPU 75 in addition to the DC-DC converter 67 of FIG. 5. The semiconductor module 1 comprises n power MOS chips 5, 7 and the drive IC chip 9.

The drive IC chip 9 includes high-potential and low-potential driven chip number decision tables 187, 189; high-potential and low-potential driven chip number switchers 191, 193; and high-potential and low-potential chip drivers 195-1 to 195-n, 197-1 to 197-n. The chip drivers correspond to the respective chips.

Pieces of data on the number of chips driven in response to the load current are stored in the tables 185, 187. The data are previously determined in consideration of the on-resistance, the gate capacitance and the number of the power MOS chip 5, 7. The value of the load current detected by the load current detector 185 is compared with the data in the table 187, 189 to decide a certain number of chips actually driven.

On the basis of this decision, the driven chip number switchers 191, 193 operate a certain number of chip drivers of the chip drivers 195-1 to 195-n, 197-1 to 197-n to drive a certain number of power MOS chips on the high-potential side and the low-potential side.

A major effect of the twelfth embodiment is described. Losses in a synchronous commutation step-down DC-DC converter include a steady-state loss caused by the on-resistance of the power MOS chip and other losses (such as a switching loss and a gate charge loss). The loss in the large current operation of the DC-DC converter mainly belongs to the steady-state loss while the loss in the small current operation mainly belongs to the other losses. Therefore, it is effective to reduce the steady-state loss in the large current operation of the DC-DC converter while it is effective to reduce the other losses in the small current operation.

A reduction in steady-state loss can be achieved by a lowered on-resistance of MOS. A reduction in other losses can be achieved by a lowered gate capacitance. An increased area of the power MOS chip can lower the on-resistance of MOS but results in an increased gate capacitance. To the contrary, a decreased area of the power MOS chip can lower the gate capacitance but results in an increased on-resistance of MOS.

Therefore, it is advantageous to increase the area of the power MOS chip in the large current operation and decrease the area of the power MOS chip in the small current operation. In the twelfth embodiment, the number of the driven power MOS chips 5, 7 is varied based on the value of current flowing in the load to adjust the area of the power MOS chip 5, 7. In a word, the number of the driven power MOS chips 5, 7 is increased in the large current operation and decreased in the small current operation. Accordingly, in the twelfth embodiment, the DC-DC converter can operate efficiently regardless of the large current operation and the small current operation.

Thirteenth Embodiment

Figure 51:
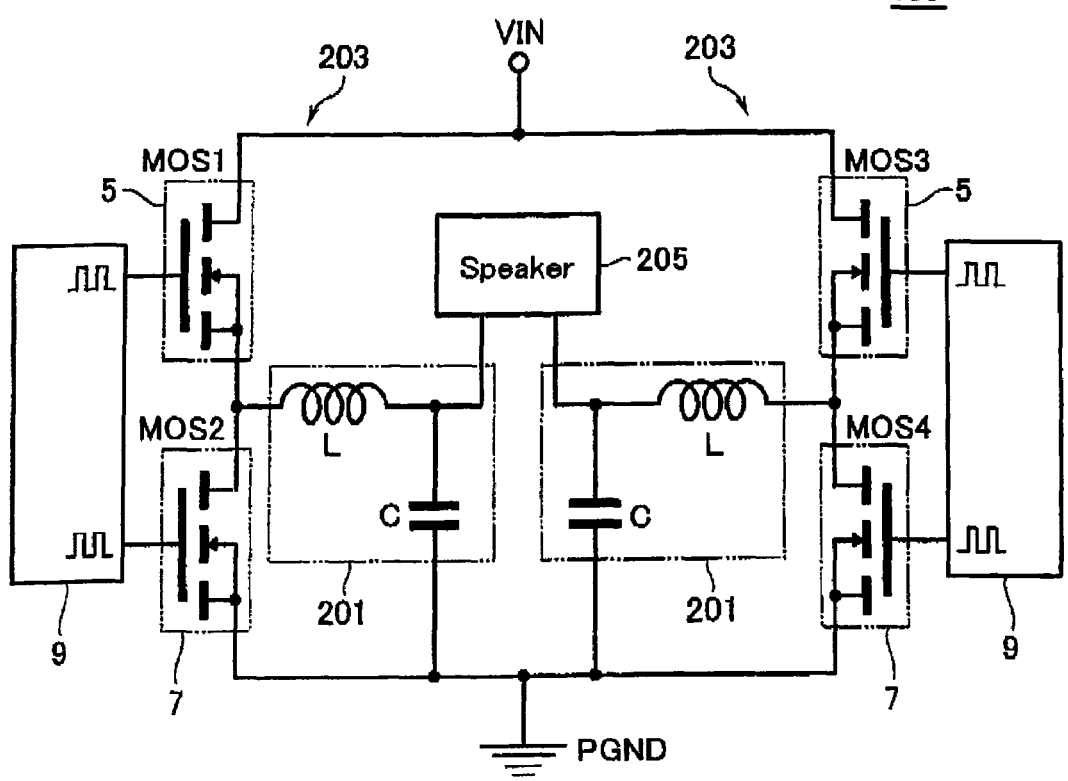
FIG. 51 is a circuit diagram of a speaker driver according to a thirteenth embodiment.

A thirteenth embodiment is directed to a speaker driver applicable to FDA (Full Digital Audio). FIG. 51 is a circuit diagram of the speaker driver 199 according to the thirteenth embodiment. The power MOS chips 5, 7, the drive IC chip 9 and a low-pass filter 201 composed of L and C are contained in a set 203. Two such sets 203 correspond to a channel (speaker).

A state of MOS1 (chip 5) and MOS4 (chip 7) kept on and MOS2 (chip 7) and MOS3 (chip 5) kept off and a state of MOS1 and MOS4 kept off and MOS2 and MOS3 kept on are alternately repeated to drive the speaker 205. In general, MOS1, MOS2, MOS3 and MOS4 employ chips having the same property. Therefore, as shown below, the chip 5 and the chip 7 are sized similarly and both shaped square.

Figure 52:
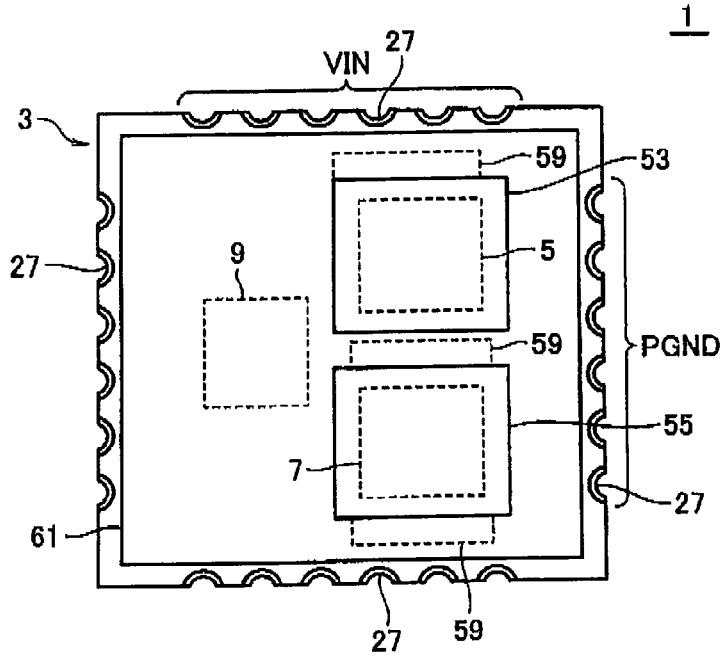
FIG. 52 is a plan view of a semiconductor module (half-bridged) contained in the speaker driver of FIG. 51.
Figure 53:
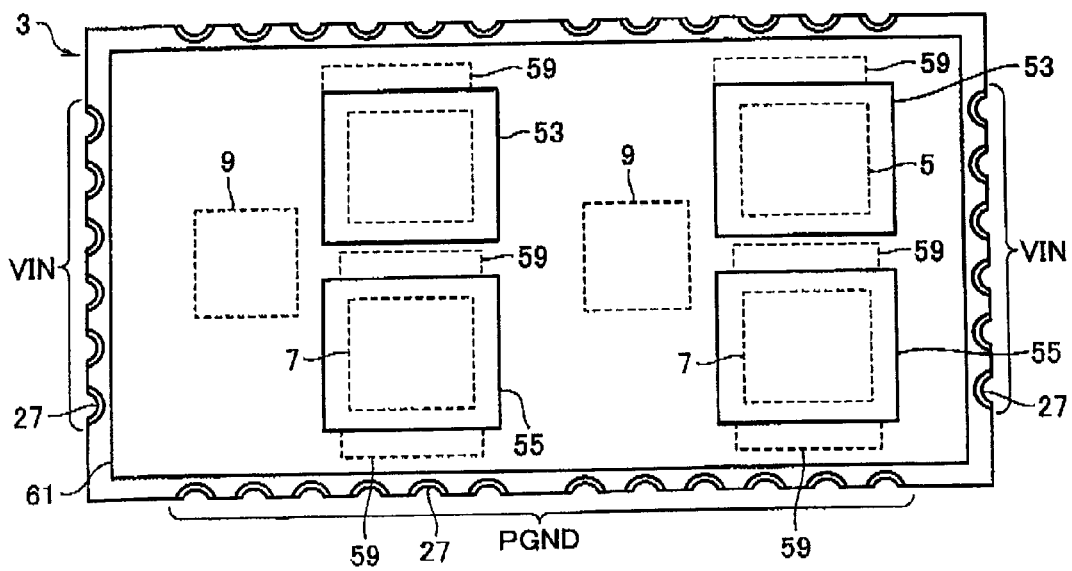
FIG. 53 is a plan view of a semiconductor module (full-bridged) contained in the speaker driver of FIG. 51.

For configuration of the speaker driver of FIG. 51 with the semiconductor module(s), the following two ways can be considered. One is the use of a semiconductor module 1 (half-bridged) that includes one set 203 mounted thereon as shown in FIG. 52. In this case, two such semiconductor modules 1 are required. Another is the use of a semiconductor module 1 (full-bridged) that includes two sets 203 mounted thereon as shown in FIG. 53. In this case, a single semiconductor module 1 configures the speaker driver 199. In either case, the low-pass filter 201 is not depicted. In one set 203, the drive IC chip 9 is located equidistant from the power MOS chip 5 and the power MOS chip 7.

Similar to the eleventh embodiment shown in FIG. 46, location of the VIN terminal adjacent to the PGND terminal shortens the length of the wire associated with the decoupling condenser attached externally. The chips 5, 7, 9 are arranged such that the wires connected to the gates of the power MOS chips 5, 7 from the drive IC chip 9 are shortened.

What is claimed is:

1. A semiconductor module, comprising:

a mounting board;

a plurality of power switching device chips each having an upper surface and a lower surface and mounted on said mounting board by flip-chip bonding with said upper surface faced toward said mounting board;

a drive IC chip mounted on said mounting board by flip-chip bonding and configured to operate to drive gates of transistors formed in said plurality of power switching device chips;

a plurality of heat sink members located respectively on said lower surfaces of said plurality of power switching device chips;

a resinous member provided to seal said plurality of power switching device chips and said drive IC chip in a single package;

a power source terminal and a ground terminal of a circuit configured by said plurality of power switching device chips; and a built-in decoupling condenser connected between said power source terminal and said ground terminal, wherein said heat sink members serve as wires that connect said power switching device chips and said mounting board, wherein said drive IC chip includes a gate driver and a signal transmitter transmitting a signal from outside to said gate driver;

wherein said power source terminal includes a VDD terminal as a power source terminal of said drive IC chip; and a VIN terminal as a power source terminal of a circuit configured by said plurality of power switching device chips;

wherein said ground terminal includes an IC-PGND terminal as a ground terminal of said gate driver, a SGND terminal as a ground terminal of said signal transmitter, and a PGND terminal as a ground terminal of a circuit configured by said plurality of power switching device chips;

and wherein said decoupling condenser includes a first decoupling condenser connected between said VDD terminal and said IC-PGND terminal, a second decoupling condenser connected between said VDD terminal and said SGND terminal, and a third decoupling condenser connected between said VIN terminal and said PGND terminal.

2. The semiconductor module according to claim 1, wherein said mounting board includes a recess for embedding said decoupling condenser.

* * * * *